(12) United States Patent
Glavish et al.

(10) Patent No.: US 7,851,773 B2
(45) Date of Patent: Dec. 14, 2010

(54) ION BEAM APPARATUS AND METHOD EMPLOYING MAGNETIC SCANNING

(75) Inventors: Hilton F. Glavish, Incline Village, NV (US); Thomas N. Horsky, Boxborough, MA (US); Dale C. Jacobson, Salem, NH (US); Sami K. Hahto, Nashua, NH (US); Masao Naito, Kyoto (JP); Nobuo Nagai, Kyoto (JP); Nariaki Hamamoto, Kyoto (JP)

(73) Assignee: Semiquip, Inc., North Billerica, MA (US)

( * ) Notice: Subject to any disclaimer, the term of this patent is extended or adjusted under 35 U.S.C. 154(b) by 181 days.

(21) Appl. No.: 12/301,557
(22) PCT Filed: Jun. 13, 2007
(86) PCT No.: PCT/US2007/013985
§ 371 (c)(1),
(2), (4) Date: Nov. 19, 2008
(87) PCT Pub. No.: WO2007/146395
PCT Pub. Date: Dec. 21, 2007

(65) Prior Publication Data
US 2009/0261248 A1    Oct. 22, 2009

Related U.S. Application Data

(60) Provisional application No. 60/813,431, filed on Jun. 13, 2006.

(51) Int. Cl.
*H01J 37/317* (2006.01)
*H01J 37/28* (2006.01)
*H01L 21/265* (2006.01)
(52) U.S. Cl. .............. 250/492.21; 250/492.2; 250/492.3; 250/423 R; 250/396 ML; 250/396 R; 250/281
(58) Field of Classification Search ............ 250/492.21, 250/492.2, 492.3, 396 ML, 396 R, 423 R, 250/281
See application file for complete search history.

(56) References Cited

U.S. PATENT DOCUMENTS 4,800,100 A    1/1989    Herbots et al.

(Continued)

OTHER PUBLICATIONS

Ed A. Septier, "Focusing of Charged Particles, Deflecting Magnets", Enge, Chapter 4.2, pp. 203-264.

*Primary Examiner*—Nikita Wells
(74) *Attorney, Agent, or Firm*—John S. Paniaguas; Katten Muchin Rosenman LLP

(57) ABSTRACT

A multipurpose ion implanter beam line configuration comprising a mass analyzer magnet followed by a magnetic scanner and magnetic collimator combination that introduce bends to the beam path, the beam line constructed for enabling implantation of common monatomic dopant ion species cluster ions, the beam line configuration having a mass analyzer magnet defining a pole gap of substantial width between ferromagnetic poles of the magnet and a mass selection aperture, the analyzer magnet sized to accept an ion beam from a slot-form ion source extraction aperture of at least about 80 mm height and at least about 7 mm width, and to produce dispersion at the mass selection aperture in a plane corresponding to the width of the beam, the mass selection aperture capable of being set to a mass-selection width sized to select a beam of the cluster ions of the same dopant species but incrementally differing molecular weights, the mass selection aperture also capable of being set to a substantially narrower mass-selection width and the analyzer magnet having a resolution at the mass selection aperture sufficient to enable selection of a beam of monatomic dopant ions of substantially a single atomic or molecular weight, the magnetic scanner and magnetic collimator being constructed to successively bend the ion beam in the same sense, which is in the opposite sense to that of the bend introduced by the analyzer magnet of the beam line.

40 Claims, 24 Drawing Sheets

U.S. PATENT DOCUMENTS

| | | |
|---|---|---|
| 5,311,028 A | 5/1994 | Glavish |
| 5,350,926 A | 9/1994 | White et al. |
| 5,393,984 A | 2/1995 | Glavish |
| 5,629,528 A | 5/1997 | Jost et al. |
| 5,814,819 A | 9/1998 | Sinclair et al. |
| 6,130,436 A | 10/2000 | Renau et al. |
| 6,403,967 B1 | 6/2002 | Chen et al. |
| 6,774,378 B1 | 8/2004 | Huang et al. |
| 2002/0003208 A1 | 1/2002 | Dudnikov |
| 2002/0066872 A1 | 6/2002 | Nishihashi et al. |
| 2002/0121613 A1 | 9/2002 | Scheuer et al. |
| 2003/0122090 A1 | 7/2003 | Tsukihara et al. |
| 2003/0201402 A1 | 10/2003 | Ye et al. |
| 2005/0258380 A1 | 11/2005 | White et al. |
| 2006/0097193 A1* | 5/2006 | Horsky et al. .......... 250/492.21 |
| 2009/0206270 A1* | 8/2009 | Glayish et al. ........ 250/396 ML |

* cited by examiner

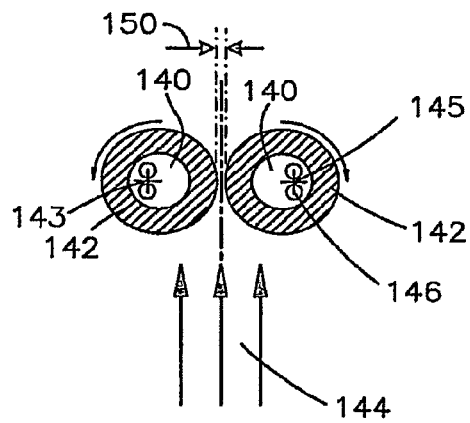
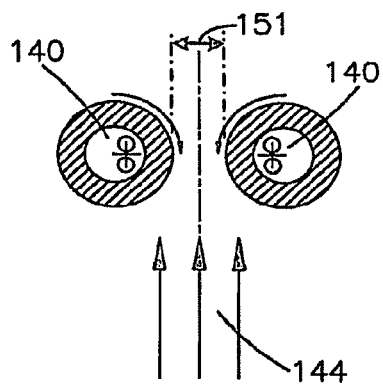
FIG. 10A
FIG. 10B
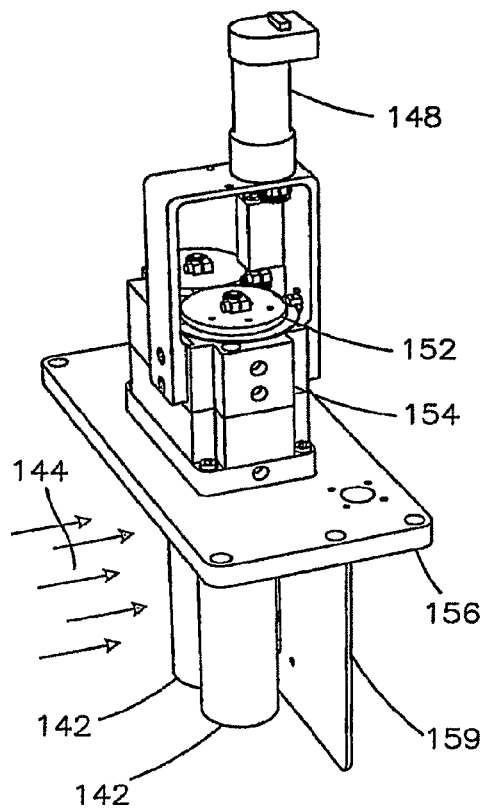
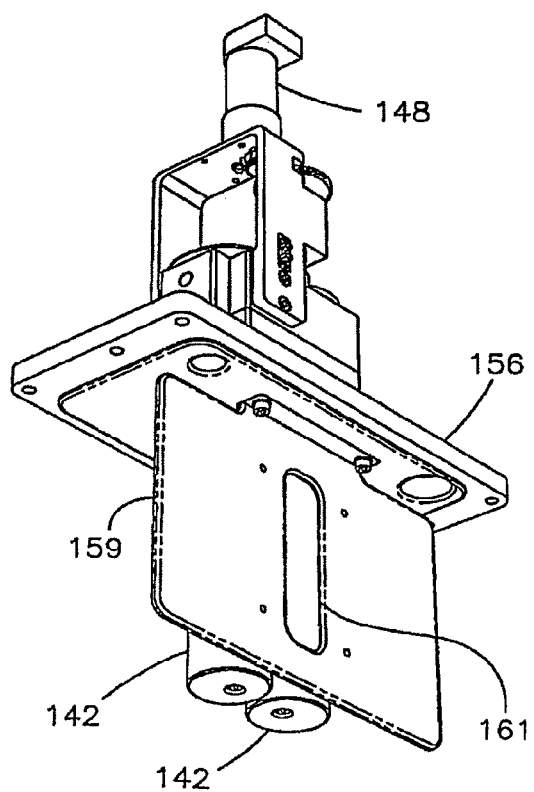
FIG. 10C
FIG. 10D

Non-dispersive plane

Magnetically scanned $B_{18}H_x^+$ beam currents

ION BEAM APPARATUS AND METHOD EMPLOYING MAGNETIC SCANNING

CROSS REFERENCE TO RELATED APPLICATIONS

This application is the U.S. national phase under 35 U.S.C §371 of International Patent Application No. PCT/US2007/013985, filed Jun. 13, 2007, which claims priority to and the benefit of U.S. Provisional Patent Application No. 60/813,431, filed Jun. 13, 2006.

The field of invention relates to ion implanting into semiconductor wafers and other substrate targets. It relates in particular to efficiently implanting molecular ions which contain multiple atoms of an electrical dopant species such as the elements B, P, As, Sb, and In which lie in the periodic table on either side of the group IV elements of C, Si, Ge, and Sn, and also for efficiently implanting molecular ions which contain multiple atoms of elements such as C, Si, or Ge which are now being used for modifying the semiconductor substrate to effectuate, for example, amorphization, dopant diffusion control, stress engineering, or defect gettering. Such molecular implants, particularly those with ions having a large multiplicity of atoms of interest, i.e. 4 or more, are useful for fabricating integrated circuits with critical dimensions of 60 nm and less. The field of invention also relates to implanter beam line configurations that are also suitable for the commonly used single atom dopant ions, and especially to multipurpose implanter beam line configurations useful for implanting all three classes of the aforementioned ions.

BACKGROUND

For the case of high dose, low energy implants, the potential advantage of using molecular ions containing multiple atoms of elements of interest has been well recognized for several years. For a given ion beam current the dose is increased in proportion to the atomic multiplicity of the element of interest. Such ions can be extracted from a source and transported to the wafer or other target substrate at a much higher energy, in proportion to the ratio of the molecular mass to the atomic mass of the element of interest. Consequently, for relatively high dose implants, the wafer throughput is not as seriously limited by the internal space charge forces and the intrinsic thermal ion temperature within the ion beam. Also, for a given dose, the electrical charge delivered to the wafer by the beam is substantially less.

However, it is desirable to overcome a number of drawbacks that exist when an attempt is made to use such molecular ions in a conventional implanter. Firstly, the ion source of a conventional ion implanter has a relatively high density, hot plasma and heavy molecular ions are substantially disintegrated by such a source, often resulting in a low molecular ion yield. Secondly, the molecular ions are often generated with a range of masses as a result of various amounts of hydrogen atoms within the ion and also as a result of the binomial distribution of isotopic masses if there is more than one isotope of an element present in the generated ions. The different mass ions generally describe different paths through the implanter beam line and as a result can produce undesirable angular and/or dose variations over the surface of a wafer. Thirdly, the relatively high mass of the molecular ions limits the single atom implant energy, often to just a few keV because of the limited field strength and size of the conventional analyzer magnet (and other magnetic elements if used).

To minimize the commercial costs associated with constructing and operating an ion implanter tool, it is also desired to have an ion implanter that is multipurpose, capable not only of overcoming the drawbacks associated with implanting the molecular ions, but also capable of implanting common monatomic dopant species.

Furthermore, it is desirable, even with ion implanters that are constructed principally for implanting common monatomic dopant species, to enable efficient operation over a wide range of ion densities in the beam in order to meet the large dynamic range of doses generally required, to provide high ion purity at the target with respect to the ion energy resolution and with respect to freedom from ion species which would degrade the semiconductor structures, and to impinge ions on to the wafer substrate with a small angular spread, good angular definition, and good dose uniformity over the surface of the wafer.

SUMMARY

According to one aspect of invention a multipurpose ion implanter beam line configuration comprises a mass analyzer magnet followed by a magnetic scanner and magnetic collimator combination that introduce bends to the beam path, the beam line constructed for enabling implantation of common monatomic dopant ion species cluster ions, the beam line configuration having a mass analyzer magnet defining a pole gap of substantial width between ferromagnetic poles of the magnet and a mass selection aperture, the analyzer magnet sized to accept an ion beam from a slot-form ion source extraction aperture of at least about 80 mm height and at least about 7 mm width, and to produce dispersion at the mass selection aperture in a plane corresponding to the width of the beam, the mass selection aperture capable of being set to a mass-selection width sized to select a beam of the cluster ions of the same dopant species but incrementally differing molecular weights, the mass selection aperture also capable of being set to a substantially narrower mass-selection width and the analyzer magnet having a resolution at the mass selection aperture sufficient to enable selection of a beam of monatomic dopant ions of substantially a single atomic or molecular weight, the magnetic scanner and magnetic collimator being constructed to successively bend the ion beam in the same sense, which is in the opposite sense to that of the bend introduced by the analyzer magnet of the beam line.

Implementations of this aspect of invention may have one or more of the following features.

The mass selection aperture is capable of being set to a first setting for monatomic ion species and a second setting of at least fifteen times the mass-selection width of the first setting for accepting cluster ions generated from boron-containing compounds. The resolution of the mass analyzer magnet at the mass selection aperture for monatomic doping ions is at least 60. The mass analyzer magnet is sized constructed and arranged to form at the mass selection aperture a conjugate image in the mass dispersive plane of the width of the ion source extraction aperture. The mass selection aperture of the analyzer magnet is capable of being set to an aperture width of at least 30 mm. The analyzer magnet is constructed to analyze a beam extracted from a slot-form ion source extraction aperture of at least 12 mm width and 90 mm height. The mass selection aperture is capable of being set to a first setting for the monatomic ion species and to a second setting of at least fifteen times the mass-selection width of the first setting for accepting cluster ions of multiple masses near a peak of interest, and the resolution of the mass analyzer magnet at the mass selection aperture for monatomic doping ions is at least 60. The slot-form extraction aperture width is about 12.5 mm and height about 100 mm. The ion implanter beam line is provided in combination with an ion source constructed to produce ions of current density up to about 1 mA/cm² by an ionization mode employing a formed electron beam, the ion source constructed to receive feed material alternatively in the forms of gas and heated vapor. The ion source is constructed to function alternatively in a second ionization mode employing arc discharge. The analyzer magnet is a sector magnet constructed to produce an adjustable magnetic field in the pole gap including a field exceeding about 10 kGauss. The ion implanter beam line is constructed to select about 80 keV ions generated from octadecaborane. The mass analyzer comprises a sector magnet having a radius R of about 500 mm, a sector angle Φ of about 120 degrees, a distance b from the pole exit to the mass resolving aperture of about 195 mm, the mass analyzer having a magnification M of about −0.83, the analyzer magnet constructed to analyze an ion beam from a source having an extraction aperture width of about 12.5 mm, the analyzer magnet having mass resolution m/Δm of the order of about 88. The ion implanter beam line includes a multiple element quadrupole focusing lens in the portion of the beam line following the analyzer magnet, the lens arranged to control the dimensions of the beam in orthogonal directions of the beam cross-section. The lens has at least three quadrupole elements and is constructed to simultaneously control the dimensions and angular divergence of the beam in orthogonal directions of the beam cross-section. The lens is a quadrupole triplet focusing lens. The lens is a magnetic quadrupole triplet focusing lens. The ion implanter beam line is constructed to produce a beam having an elongated cross-section profile entering the quadrupole triplet focusing lens, with the long dimension of the beam profile in the plane normal to the plane of the bend of the analyzer magnet, in combination with a control adapted to cause the first lens element of the triplet to cause focusing in the long profile dimension, the second lens element to have polarity opposite to that of the first element to cause focusing in the short dimension and defocusing in the long dimension, and the third lens element to have the same polarity as the first element, field strengths of the lens elements controlled, respectively, to achieve simultaneous focusing in both dimensions of the elongated profile. The ion implanter beam line includes a decelerating unit following the analyzer magnet and preceding the quadrupole lens, the lens controlled to control beam divergence resulting from deceleration of the beam at the decelerating unit. The ion implanter beam line has beam line features and parameters of substantially the following values;

A. Analyzer Magnet: R=500 mm, φ=120°; G=118 mm; $s_1$=31 mm; $s_2$=8.6 mm; $h_1$=8.7 mm; $h_2$=4.7 mm; W=166 mm; bending power=80 keV octadecaborane.
B. Mass selection aperture: about 8 mm minimum to about 38 mm maximum.
C. Quadrupole triplet focusing lens: aperture: 80 diagonal between pole tips; pole tip field adjustable 0-5 kGauss.
D. Beam Scanning Magnet; Vertical gap=80 mm; bending power=80 keV octadecaborane.
E. Collimator: Bending radius 900 mm; Pole gap=8 mm; bending power=80 keV octadecaborane and the total deflection introduced by the scanner and collimator combination being about 30°.

Another aspect of the invention is an ion implanter beam line configuration constructed for enabling implantation of cluster ions, the beam line configuration comprising a mass analyzer magnet followed by a magnetic scanner and magnetic collimator combination that introduce bends to the beam path, the mass analyzer magnet defining a pole gap between ferromagnetic poles of the magnet and a mass selection aperture, the pole gap sized to accept an ion beam from a low density ion source that produces the cluster ions, the mass selection aperture capable of being set to a mass-selection width sized to select a beam of the cluster ions of the same dopant species but incrementally differing molecular weights, the ion implanter beam line including a multi-element focusing system in the portion of the beam line following the analyzer magnet which comprises multiple quadrupole focusing elements, the individual field strengths of the lens elements of the lens system adjusted to control the dimensions of the beam in orthogonal directions of the beam cross-section and to simultaneously and substantially remove angular deviation at the target substrate that otherwise would occur as a result of the range of different masses of the cluster ions in the ion beam the magnetic scanner and magnetic collimator being constructed to successively bend the ion beam in the same sense, which is in the opposite sense to that of the bend introduced by the analyzer magnet of the beam line.

Implementations of this aspect of invention may have one or more of the following features.

The lens system has at least three quadrupole elements and is constructed to simultaneously control the dimensions and angular divergence of the beam in orthogonal directions of the beam cross-section by quadrupole fields. The lens system is a quadrupole triplet focusing lens. The lens is a magnetic quadrupole triplet focusing lens. The ion implanter beam line is constructed to produce a beam with an elongated cross-section profile entering the quadrupole triplet focusing lens, with the long dimension of the beam profile in the plane normal to the plane of the bend of the analyzer magnet, in combination with a control adapted to cause the first lens element of the triplet to cause focusing in the long profile dimension, the second lens element to have polarity opposite to that of the first element to cause focusing in the short dimension and defocusing in the long dimension, and the third lens element to have the same polarity as the first element, field strengths of the lens elements controlled, respectively, to achieve simultaneous focusing in both dimensions of the elongated profile. The ion implanter beam line includes a decelerating unit following the analyzer magnet and preceding the quadrupole lens system in the form of a quadrupole triplet lens, the quadrupole lens system controlled to control beam divergence resulting from deceleration of the beam at the decelerating unit.

Another aspect of invention is an ion implantation beam line for use with an ion source, the beam line comprising a mass analyzer magnet followed by a magnet scanner and magnetic collimator combination that introduce bends to the beam path, the analyzer magnet for an ion implanter beam line comprising a sector magnet having a center path radius of about 500 mm, a sector angle of about 120° and a pole gap of at least about 80 mm, the magnet associated with a single pair of coils, the magnet having entrance and exit pole faces perpendicular to the axis of the ion beam path entering and leaving the pole gap, the analyzer magnet having substantially no focusing effect upon the beam in the plane perpendicular to the plane of bend of the sector magnet, the magnetic scanner and magnetic collimator being constructed to successively bend the ion beam in the same sense, which is in the opposite sense to that of the bend introduced by the analyzer magnet of the beam line.

Implementations of this aspect of invention may have one or more of the following features.

The ion implantation beam is in combination with an ion focusing system preceding the magnet providing beam focusing in the plane perpendicular to the mass-dispersive plane of the magnet. The focusing system comprises lens elements of an ion extraction system associated with the ion source. The pole gap of the analyzer magnet is substantially wider than the corresponding dimension of the maximum size ion beam it is constructed to pass, there being a lining of graphite or silicon between faces of the poles and the beam path. Pole members of the analyzer magnet defining the pole gap have pole faces shaped with trenches and shims that respectively lower and raise the pole surfaces toward the median plane of the beam path to shape the magnetic field in manner enabling use of relatively small pole width in relation to the pole gap dimension. Pole members defining the pole gap are embedded in and sealed to the wall of a vacuum housing of nonmagnetic material through which the ion beam passes while subjected to the magnetic field of the analyzer magnet, and ferromagnetic structure of the magnet between the pole members being located outside of the vacuum housing. The analyzer magnet is a sector magnet constructed to produce an adjustable magnetic field in the pole gap including a field exceeding about 10 kGauss. The analyzer magnet is constructed to analyze a beam extracted from a slot-form ion source extraction aperture of at least 12 mm width and 90 mm height The details of one or more embodiments of the foregoing aspects and features are set forth in the accompanying drawings and the description below. Other features, objects, and advantages of the invention will be apparent from the description and drawings, and from the claims.

DESCRIPTION OF DRAWINGS

FIGS. 8A and 8B shows a cross-sectional view of an analyzer pole shape while

FIGS. 10A-D shows an adjustable mass resolving aperture apparatus.

DETAILED DESCRIPTION

Figure 1:
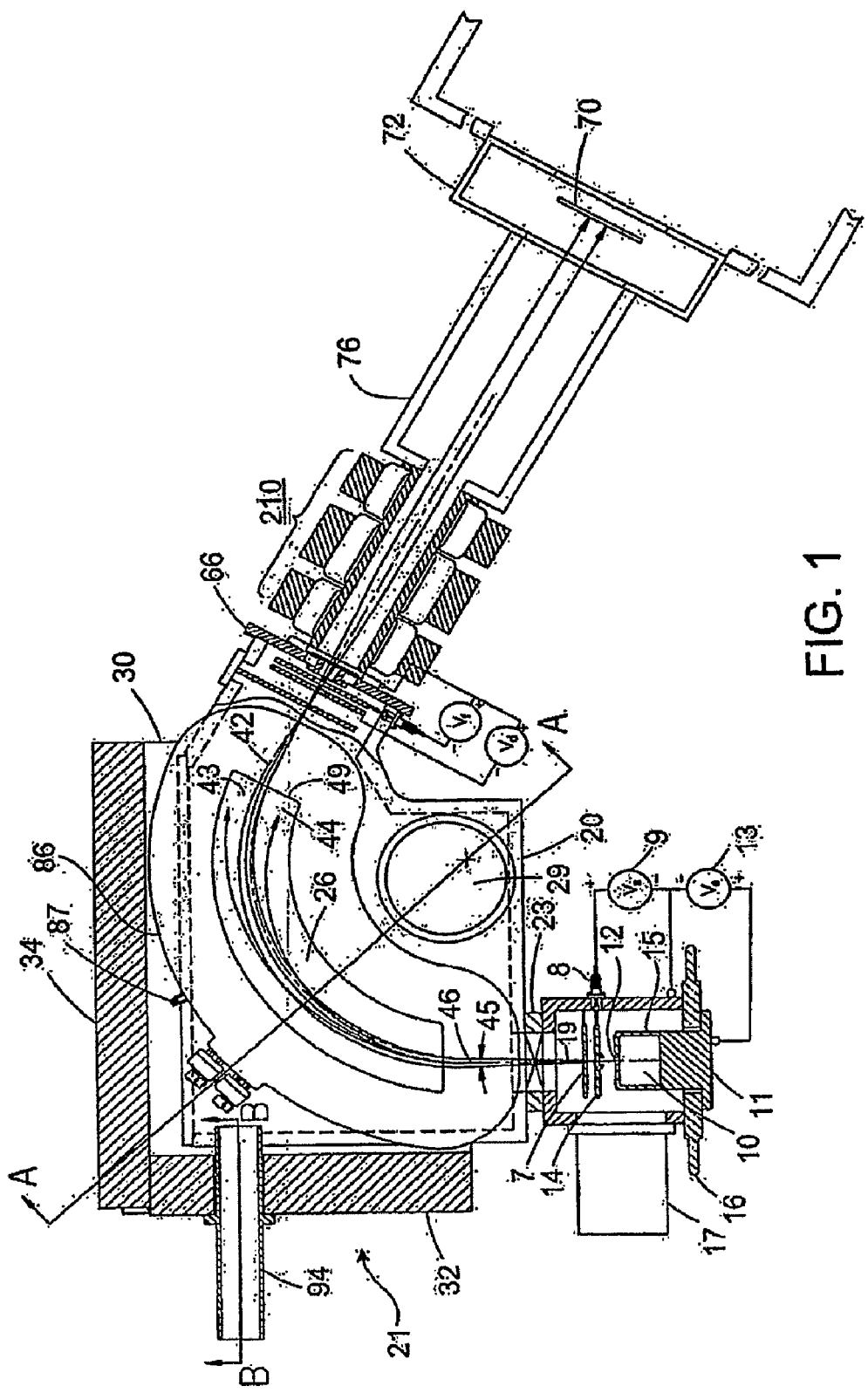
FIG. 1 is a schematic illustration of an ion implanter employing a sector mass analyzing magnet.

Referring now to the drawings, wherein identical parts are referenced by identical reference numerals and functionally similar parts by identical reference accented numerals, FIG. 1 schematically illustrates one embodiment of an ion implanter beam-line useful for efficiently implanting molecular ions which contain multiple atoms of an electrical dopant species such as the elements B, P, As, Sb, and In which lie in the periodic table on either side of the group IV elements of C, Si, Ge, and Sn, and also for efficiently implanting molecular ions which contain multiple atoms of elements such as C, Si, or Ge useful for modifying a semiconductor substrate to effectuate, for example, amorphization, dopant diffusion control, stress engineering, or defect gettering. Such molecular ions can be useful for fabricating integrated circuits with critical dimensions of 60 nm and less. Hereinafter, such ions will be collectively referred to as "cluster" ions.

The chemical composition of a singly charged cluster ion has the general form $$M_m D_n R_x H_y^+ \qquad (1)$$

where M is an atom such as C, Si, or Ge useful for material modification of the substrate; D is a doping atom such as B, P, As, Sb, or In (from group III or IV of the Periodic Table) for implanting a charge carrier in to the substrate; R is a radical, ligand, or molecule; and H is a hydrogen atom. Generally, R or H are present simply as part of the complete chemical structure needed to produce or form a stable ion and are not specifically required for the implant process. In general H is not significantly detrimental to the implant process. The same should be true for R. For example it would be undesirable for R to contain a metallic atom such as Fe, or an atom such as Br. In the above equation m, n, x, and y are all integers greater than or equal to zero, with the sum of m and n greater than or equal to two, i.e, $m+n \geq 2$. Of particular interest in ion implantation are cluster ions with a high M and/or D atomic multiplicity, i.e those with $m+n \geq 4$ because of their improved efficiency for low energy, high dose implants.

Examples of cluster ions that can be used for material modification are those derived from adjoining benzene rings such as $C_7 H_y^+$, $C_{14} H_y^+$, $C_{16} H_y^+$, and $C_{18} H_y^+$. Examples of cluster ions that can be used for doping are:

Borohydride ions: $B_{18} H_y^+$, $B_{10} H_y^+$.

Carborane ions: $C_2 B_{10} H_y^+$ and $C_4 B_{18} H_y^+$

Phosphorus hydride ions: $P_7 H_y^+$, $P_5(SiH_3)_5^+$, $P_7(SiCH_3)_3^+$.

Arsenic hydride ions: $As_5(SiH_3)_5^+$, $As_7(SiCH_3)_3^+$.

One of ordinary skill in the art can appreciate the possibility of using cluster ions other than those listed in the examples above, including: ions containing Si and Ge for material modification, ions with different amounts and different isotopes of dopant atoms, and ions with different isomeric structures. Doubly charged cluster ions are also generally formed with a much smaller yield in which case they are not as useful for high dose, low energy implantation.

The field of invention also relates to implanter beam line configurations that are also suitable for the commonly used single atom dopant ions, and especially to multi-purpose implanter beam line configurations useful for implanting all three classes of aforementioned ions.

Ions are extracted from an ion source chamber 10 inside an ion source body 11 through an aperture 12 by an accelerating electric voltage ($V_e$) 13, typically in the range of 1 kV to 80 kV, applied between an extraction electrode 14 and the ion source chamber 10. Back-streaming electrons are suppressed by applying to extraction electrode 14 a voltage ($V_s$) 9 of 2-10 kV negative with respect to the ion source vacuum housing 15 and suppressor electrode 7 via an insulated feed-through 8. The suppressor electrode 7 is at the same potential as the ion source vacuum housing 15. The ion source body 11 is insulated from the ion source vacuum housing 15 by an annular insulator 16. In one useful commercial embodiment the aperture 12 is slot shaped with a width of $w_s$=12.5 mm and a height of $h_s$=100 mm. Such an aperture width is larger than the range of between about 3-5 mm typically used in ion sources commonly used for producing conventional ions such as $B^+$, $P^+$, $As^+$, $BF_2^+$ etc. The purpose of a large ion source aperture width and height, providing a total area of 125 mm$^2$, is to provide a large area from which to extract cluster ions. This is because for one type of source useful for generating cluster ions.(see FIG. 14-16B and related description) the density of the ions is low within the chamber 10 because the ion source uses a formed electron beam rather than a high density plasma to ionize the vapor from which the cluster ions are produced. For example, such a type of ion sources are able to produce borohydride ions without significantly decomposing the borohydride vapor in the source, and, with the aperture 12 being of large size, produce high borohydride ion currents that can meet the present day important commercial wafer throughput requirements for the very high dose dual polygate structures and the medium dose but very low energy boron source drain extension implants.

Figure 11:
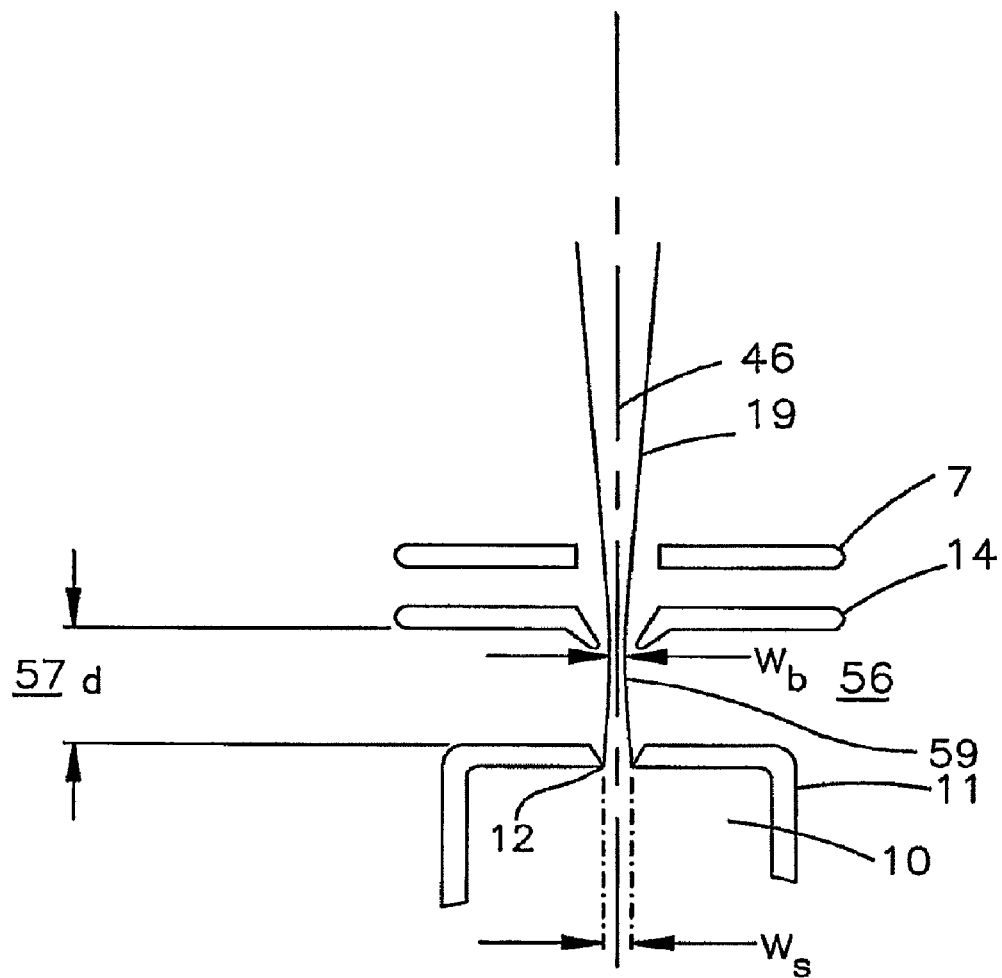
FIG. 11 shows the beam envelope in the horizontal plane in the region of the ion source.

A vacuum of typically between about $10^{-6}$-$10^{-4}$ torr is maintained in the ion source vacuum 15 housing by a vacuum pump 17. Referring to FIG. 11, the electric field generated between the extraction electrode 14 and the ion source body 11 and aperture 12 forms an approximately mono-energetic ribbon shaped beam of ions 19 with a height dimension similar to that of the ion source aperture height $h_s$, and a minimum width $w_b$ (56) approximately equal to half the width $w_s$(5) of the ion source aperture 12, i.e. $w_b \approx 0.5\ w_s$. This width $w_b$ is located in the region 59 of the ion source aperture 12 and extraction electrode 14. The spacing d (57) between the ion source aperture and extraction electrode is generally adjusted to optimize the extraction and beam formation for a given ion species, ion energy, ion mass, and ion beam current.

Figure 2:
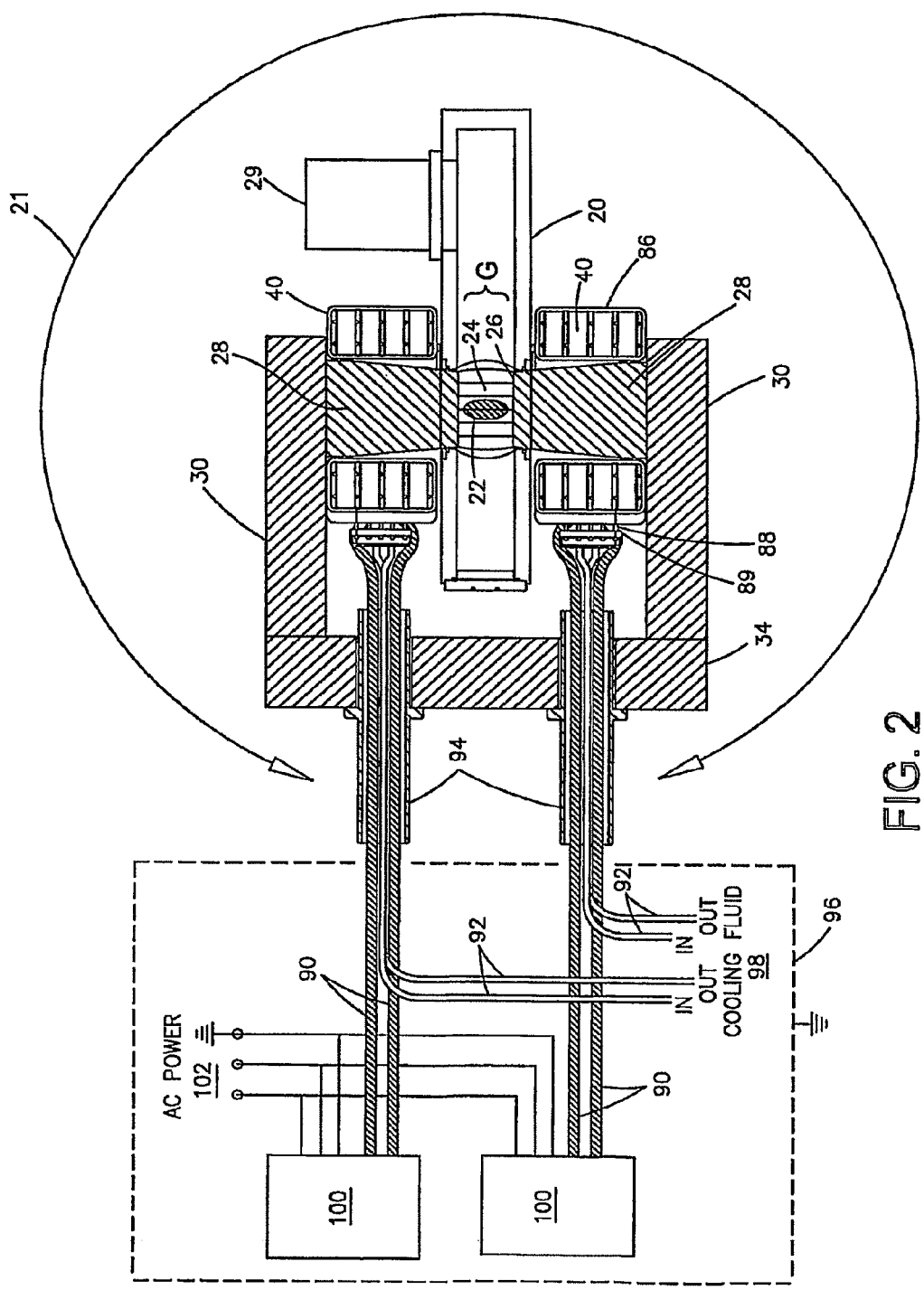
FIG. 2 is a cross-sectional view through the magnetic analyzer of FIG. 1 along section lines A-A and B-B.

After extraction from the ion source 11, the beam 19 passes into a vacuum housing 20 and then enters the magnetic field gap G of a dipole magnet 21, (FIGS. 1 and 2) in which the beam envelope becomes oval-like. Magnet 21 is comprised of current carrying coils 40, and the following ferromagnetic component parts: poles 26, cores 28, yoke cheeks 30, yoke returns 32 and 34. Referring, in particular to FIG. 2, passing DC electric current through the coil assemblies 40 generates a static magnetic field 24 generally in the vertical direction in the gap between the poles 26 where "vertical" is defined as the direction of the long direction of the source aperture 12 and for the embodiment shown in FIGS. 1 and 2 this direction is orthogonal to the generally "horizontal" bending (dispersive) plane of magnet 21.

The gas discharge from the ion source 11 is removed by a vacuum pump 17 located on the ion source housing. The vacuum pump has sufficient capacity (e.g. 1000-2000 liters/sec) to maintain a vacuum pressure in the ion source housing 15 of between about $10^{-6}$-$3 \times 10^{-5}$ torr. For maintenance ease of the ion source 10, 11, the ion source housing 15 is isolatable from the magnet vacuum housing 20 with a vacuum valve 23. The magnet housing 20 is of non-ferromagnetic material (e.g. aluminum) to prevent magnetic interaction with the magnet body. It is evacuated by vacuum pump 29.

The radial force generated by the magnetic field 24, acting on the electrical charge of the ions, causes the ions to describe substantially circular paths 42, 43, and 44 in the horizontal bending plane of the magnet 21. Since the ions extracted from the ion source chamber 10 all have approximately the same energy, magnet 21 spatially separates the trajectories of ions 43 and 44 that possess respectively higher and lower mass than ions 42 which travel along the center path 46 in the magnet pole gap. By constructing the magnet suitably large the magnetic field 24 can be set in the range from less than one kGauss to about 12 kGauss and the magnetic field can be adjusted over a wide range of masses to select a given mass corresponding to ions 42 following the center path 46. In one embodiment the center path 46 has a radius of approximately 500 mm in which case at a field of approximately 12 kGauss the magnetic analyzer is able to select 80 keV ions generated from octadecaborane ($B_{18}H_{22}$) vapor corresponding to a 4 keV boron implant energy, which is typically the highest energy needed for present day dual polygate doping. Likewise, it is able to select 80 KeV ions generated from decaborane ($B_{10}H_{14}$) vapor corresponding to a 7 KeV boron implant energy.

Referring to FIGS. 1 and 11, the paths of ions 42 emerging from the extraction electrode 14 generally have a range of angles in the horizontal plane from between about −50 milliradians to +50 milliradians with respect to the central reference path 46 attributable to such factors as thermal motion of the ions at the point of their origin in the ion source chamber 10 and the coloumb forces acting between ions of like charge. In one embodiment the shape of the pole 26 generates a magnetic field 24 in the gap that causes the ion paths of a selected mass to re-converge in the horizontal plane towards a slit-form mass resolving aperture 50 at the exit of the magnet to enable mass selection. An important aspect of the present embodiments of the magnetic analyzer 21 is that this mass selection aperture 50 is located at a point along the beam path which is near the ion optically conjugate image of the aperture width 12 with respect to transverse, horizontal ion motion. The optical magnification M of the conjugate image is typically between about −0.8 to −1.2, the negative sign implying the formation of a real inverted image. If the width of the mass resolving slit 50 is set to a value $w_r$ equal to the product of the ion beam waist width $w_b \approx 0.5\ w_s$ and the magnification M, i.e.

$$w_r \approx 0.5 |M| w_s \tag{1}$$

then most of the ions 42 of a selected mass m, emerging from ion source 11 within a horizontal angle between about −50 milliradians to +50 milliradians, will be focused through resolving slit 50 (apart from a small percentage of ions that are deflected or neutralized through collision with the residual gas in the vacuum housing 20).

Figure 6:
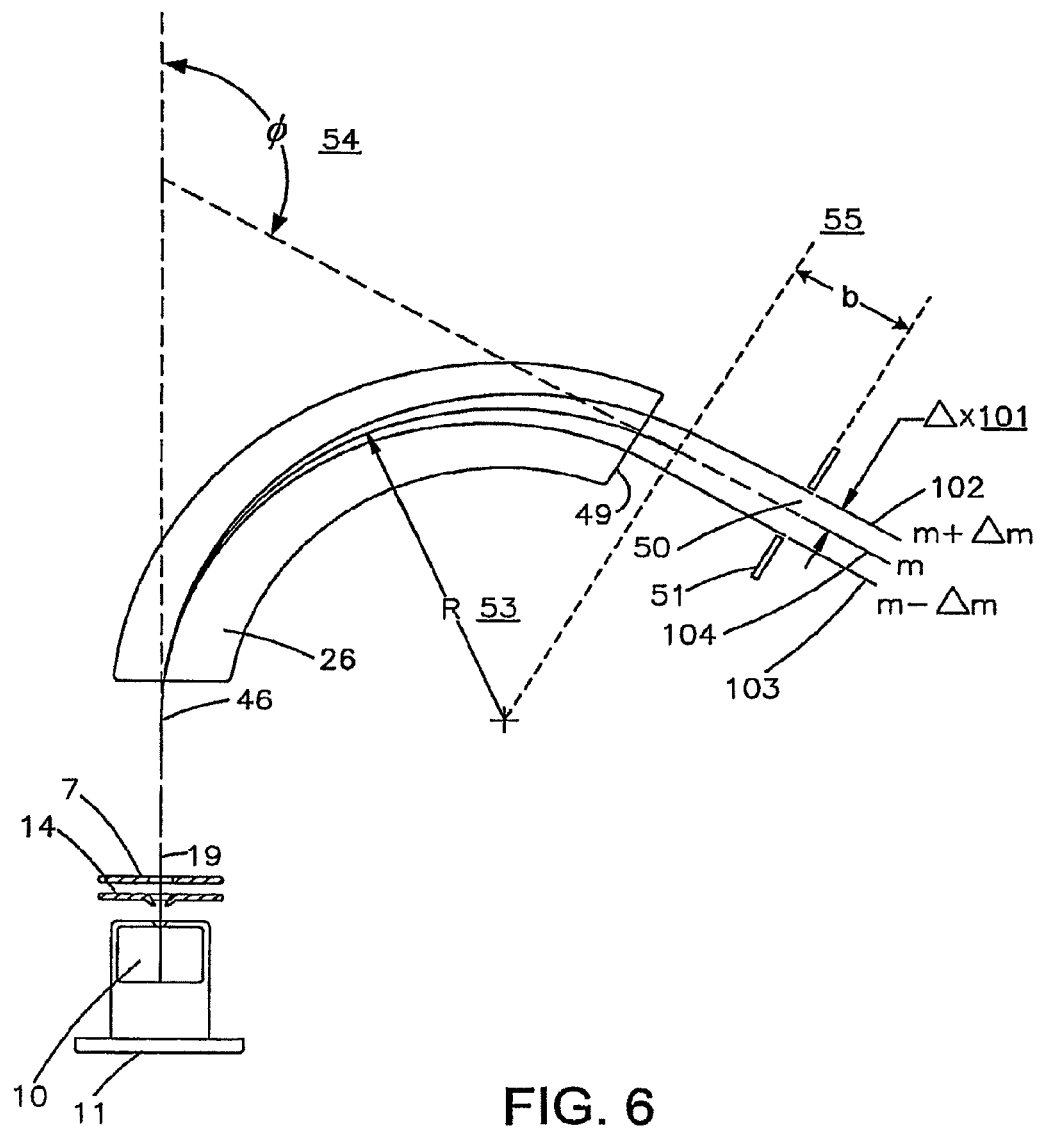
FIG. 6 is a schematic illustration showing ion paths of different mass.

Referring to FIG. 6, a property of the magnetic analyzer system 21 is that it disperses the beam wherein, at mass resolving aperture 50, ions of mass m±Δm (102, 103) are separated by a distance Δx (101) from ions of selected mass m (104) that travel along the center beam path 46. Unwanted ion masses can be stopped by either a blocking plate not shown or by the body 51 of the material used to form aperture 50. For the case of conventional monatomic dopant ions a mass resolution of m/Δm≧60 is generally required—meaning that if ions of say mass 60 amu pass through the center of the resolving aperture 50, then ions of mass≧61 amu or mass≦59 amu are rejected. The principles of focusing and dispersive effects in dipole magnets are described in detail by *Enge, Focusing of Charged Particles, Chapter 4.2 Deflecting Magnets, Ed. A. Septier*, pp 203-264.

Figure 3:
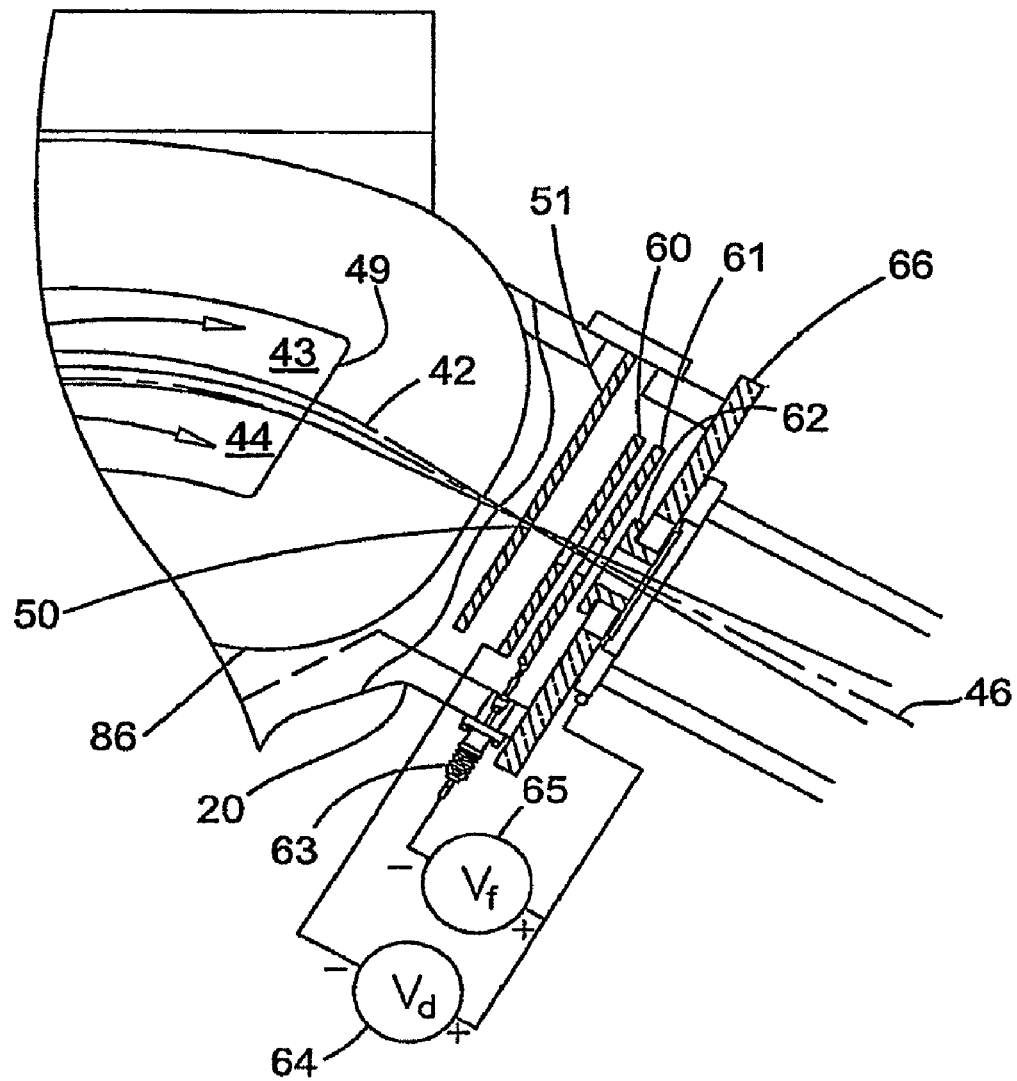
FIG. 3 is an enlarged view of the decelerator shown in FIG. 1.

Referring to FIGS. 3 and 6, for the case when the beam center path 46 is substantially orthogonal to exit pole edge 49, and the magnetic field between poles 26 over the region of the beam 22 about the center path 46 is substantially uniform and vertical, the separation Δx for a mass variation of Δm/m is approximately $$\Delta x = D \, (\Delta m/2m) \quad (2)$$

Where D is called the magnet dispersion and is given by $$D \approx R \, (1 - \cos \phi) + b \sin \phi \quad (3)$$

In the above equation, R is the radius 53 of the center path 46, $\phi$ is the angle 54 the ions bend through on passing through the magnet along the central path 46, and b (55) is the distance from the effective field boundary of the exit pole to the mass resolving aperture 50. In order to achieve a mass resolution of m/Δm with a resolving aperture width of $w_r$, it follows from Eqs. (1-3) that:

$$m/\Delta m = D/2w_r \approx D/|M|w_s \approx \{R(1-\cos\phi) + b\sin\phi\}/|M|w_s \quad (4)$$

Figure 7:
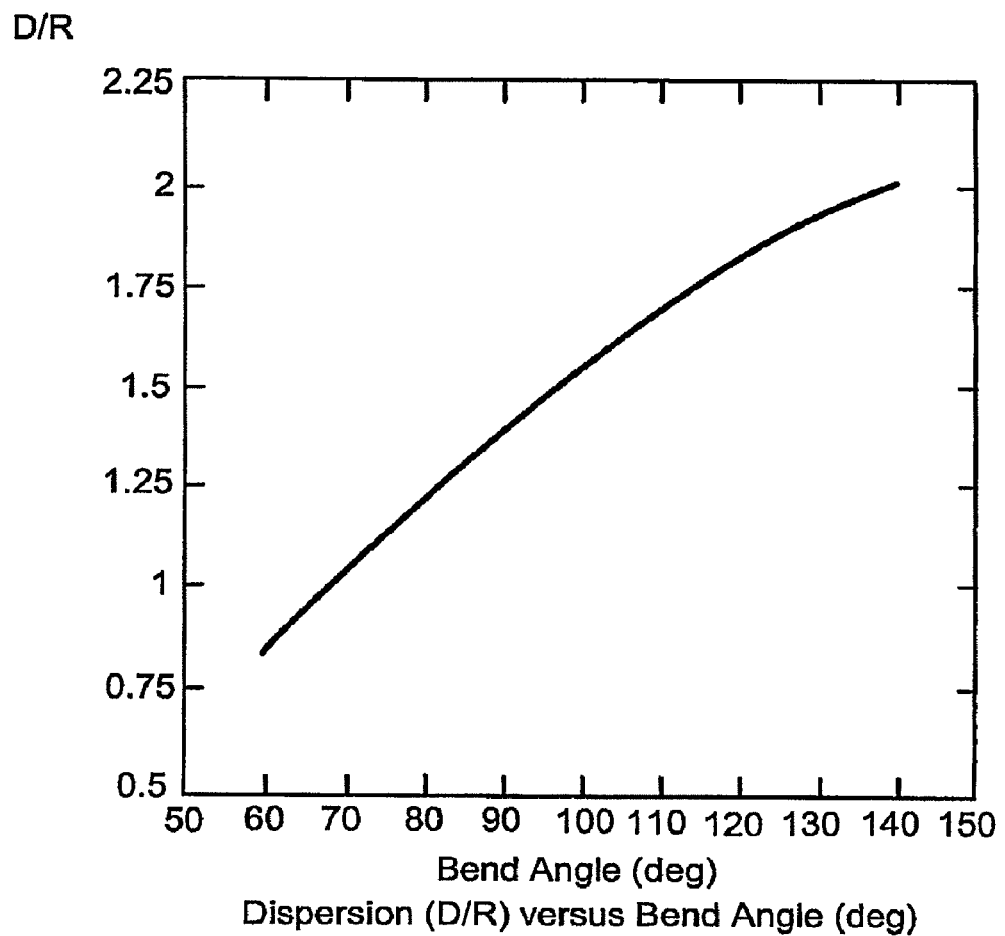
FIG. 7 shows the variation of dispersion (D/R) with bending angle.

As previously mentioned, a large source aperture width $w_s$ is needed to extract high borohydride ion currents and meet present day wafer throughput requirements for dual polygate and source drain extension boron implants. An important aspect of such magnetic analyzer embodiments is that they provide a multi-purpose system with a high enough mass resolution to also use conventional ions, even in the case of a large source aperture width $w_s$. It is found, referring to Eq. 3, this is achievable by using a sufficiently large radius R and bend angle $\phi$. In one useful commercial embodiment, R=500 mm, $\phi$=120°, b=195 mm, and M=−0.83, in which case, for a source aperture width of $w_s$=12.5 mm the mass resolution is m/Δm≈88, and therefore sufficient for conventional ions. The significance of employing a large bend angle $\phi$ is shown in FIG. 7 where D/R is plotted against $\phi$, for a conjugate image location of b=195 mm. Doubling the bend angle from 60° to 120° more than doubles the dispersion D and hence mass resolution m/Δm.

Figure 8A:
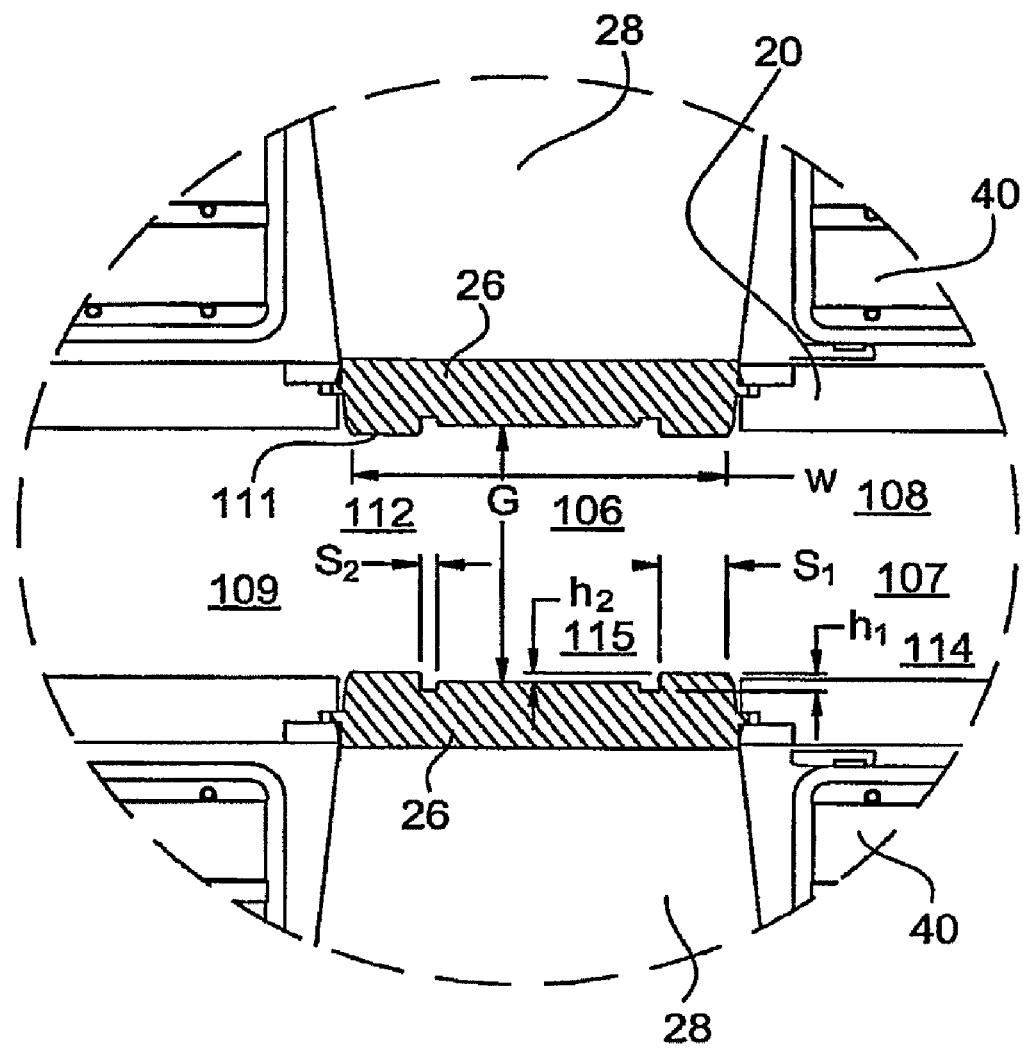
Figure 8B:
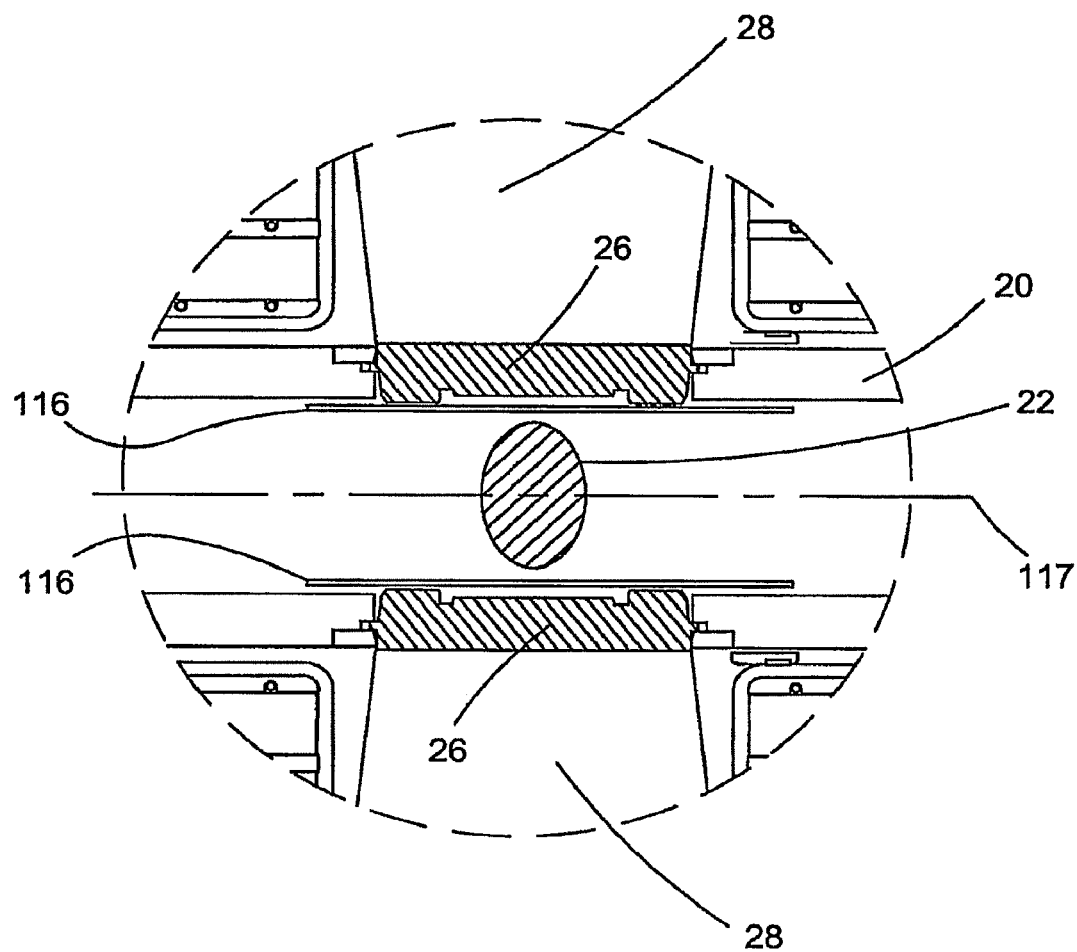

Referring to FIGS. 8A and 8B, the space between the poles 26 where the beam passes has a gap height G (106) which is typically between about 10 to 20 mm greater than the height $h_s$ of the source aperture in order to provide clear passage of the beam through the magnet and also enable the pole surfaces to be lined, e.g. with graphite (116) or silicon, to eliminate undesirable heavy metal impurities from being sputtered from the ferromagnetic pole material by beam strike. For a given maximum magnetic field capability, the mass of the magnet is proportional to the working magnetic volume V in the gap which, in turn, is the product of the path length through the pole, $\phi$R, the gap dimension G, and the pole width W, i.e.

$$V \approx \phi R \, GW \quad (4)$$

We have already observed from Eq. 3 that the requirement of a high dispersion in order to realize a mass resolution m/Δm≧60 for a wide source slit $w_s$ requires large values of $\phi$ and R. Secondly, in order to realize high borohydride ion current the gap G must also be large to accommodate ions from the large height source aperture. Collectively, these requirements can only be realized, according to Eq. 4, with an appropriately high working magnetic volume and hence high magnet mass. Finally, in order to be able to carry out 4 keV boron implants, for dual polygate implants, using 80 keV octadecaborane, the yoke and coil mass must be sufficiently high to support the correspondingly high magnetic field in the gap, which must be 12 kGauss, even for the case of a bending radius of R=500 mm. According to Eq. 4, the only recourse available to minimize the working magnetic volume V is to minimize the pole width W (108). Unfortunately, the width cannot be arbitrarily reduced in relation to the gap dimension G (106) and the cross-sectional dimensions of beam 22 for otherwise second and higher order terms develop in the gap field, producing aberration from broadening the beam at the mass resolving aperture 50, which, in effect, would reduce the mass resolving power. In one useful commercial embodiment, as shown in FIGS. 8A and 8B, the outer edges of the poles 26 are shaped with trenches 112 and shims 111 that respectively lower and raise the surface of pole 26 towards the median plane 117. Two shims, one at each side, have width $s_1$ (107) and height $h_2$ (115) relative to the central region. Two trenches located immediately inwardly of the respective shims have width $s_2$ (109) and depth $h_1$ (114) relative to the tops of the shims. This technique is found to enable a significantly smaller pole width W (108) to be used in relation to the gap dimension G (106) and the cross-sectional dimensions of beam 22 yet maintain adequate control of the field shape in the working gap to prevent second, third and fourth order aberrations from broadening the beam at resolving aperture 50.

To further control third order aberrations, another embodiment can use slightly different trench and shim parameters on the left and right hand sides of the poles of FIG. 8A.

The example illustrated, having a nominally uniform gap G of 118 mm and pole width w of 166 mm, is sufficient to accept the beam emerging from the ion source aperture while providing space for liners 116 of graphite or silicon that cover the pole face.

In the example, for achieving a simple robust design, the entrance and exit pole edges of the magnet are normal to the beam axes and there are no significant first order field gradients in the working gap of the magnet (i.e. the magnet does not produce any focusing in the non-dispersive, vertical plane, this being handled by other provisions discussed below). Consequently, in the dispersive plane, the conjugate image points for the source object and mass resolving aperture 50 are simply determined by Barber's rule (see *Enge, Focusing of Charged Particles, Chapter 4.2 Deflecting Magnets, Ed. A. Septier*, pp 203-264). In a specific example, the object source point is set at 400 mm prior to the effective entrance field boundary and the mass resolving aperture is at b=195 mm from the effective exit field boundary of the magnet. The object distance of 400 mm provides the space for pump 17 capable of high speed vacuum pumping, for in-line vacuum isolation valve 23, and for wide energy range extraction optics system 14, 7.

While this design provides excellent performance over a wide range, for the broadest aspects of invention, the magnetic analyzer system should not be limited to the aforementioned description. One of ordinary skill in the art can appreciate a variety of implementations of the analyzer optics to provide the desired multipurpose capability, including: the use of magnetic fields between the poles that are non-uniform with first and second order gradients to control focusing, aberrations, and dispersion; the choice of bending angle, radius, gap between the poles, and magnetic field range; the position of the ion source with respect to the magnet entrance; the position and size of the mass resolving aperture with respect to the magnet exit and the precise location with respect to the conjugate image point; and the choice of particular pole shape shims and trenches to minimize second and higher order image broadening at the mass resolving aperture.

Figure 9:
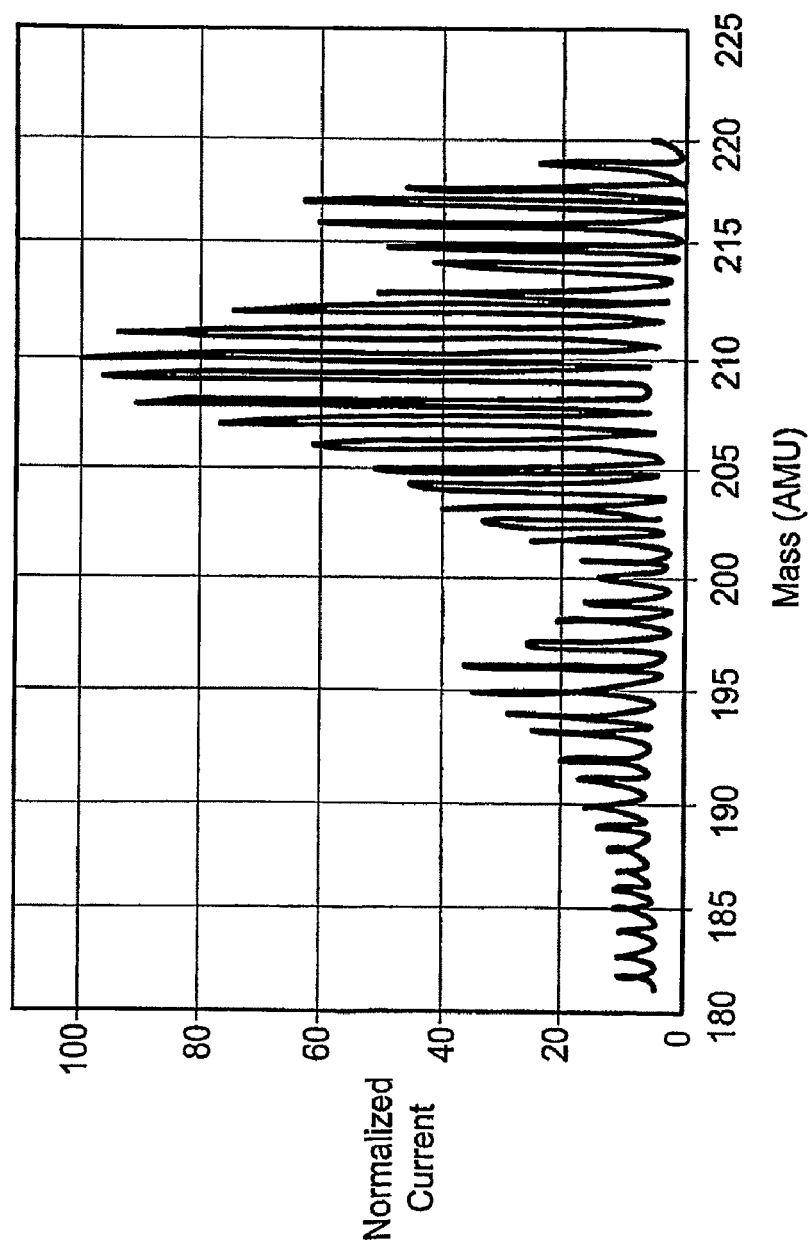
FIG. 9 show a high resolution mass spectrum of octadecaborane.
Figure 14:
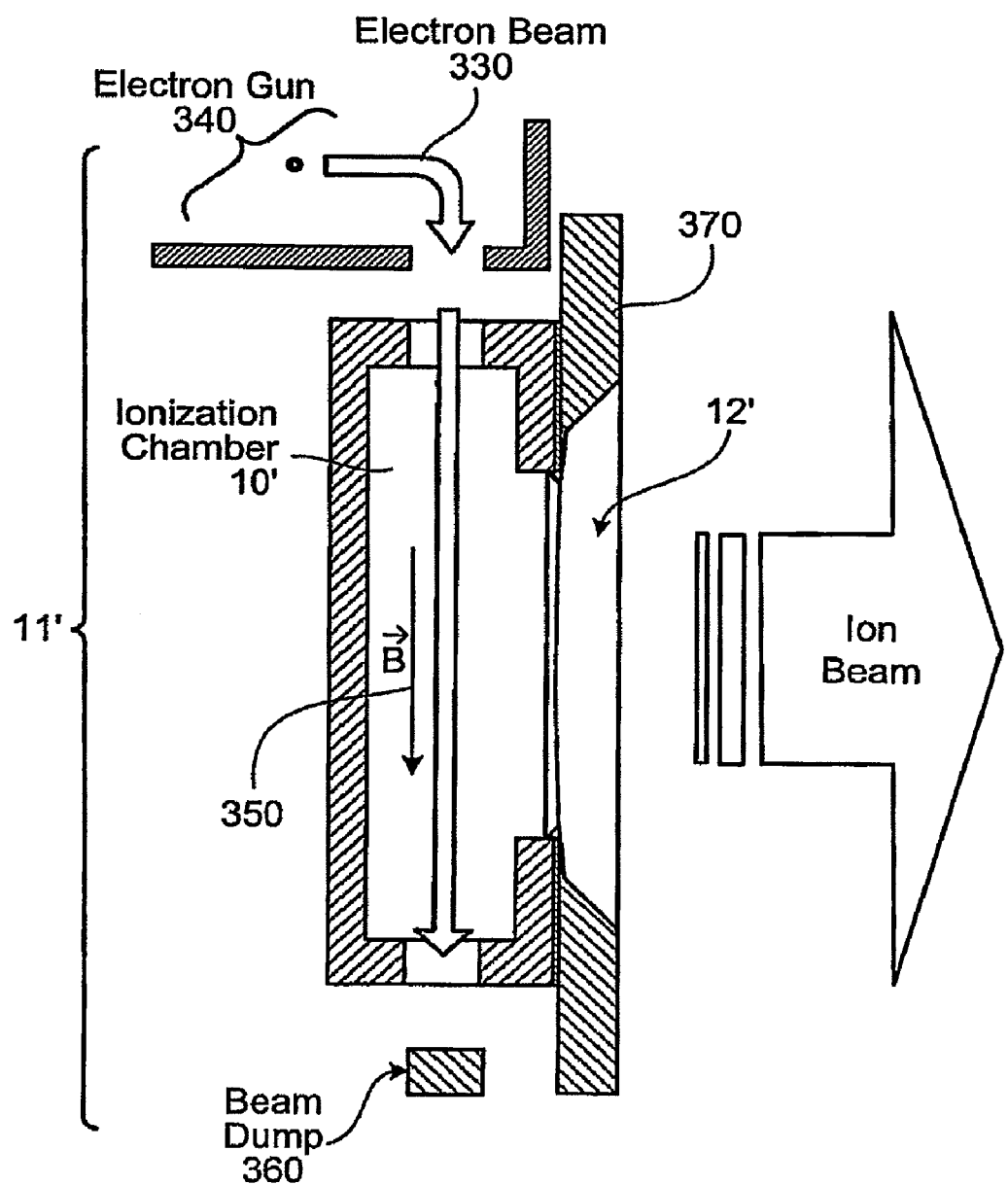
FIG. 14 is a diagrammatic vertical cross-section in the plane of an extracted ion beam, of an ion source useful in the embodiments of FIGS. 1 and 13.
Figure 15A:
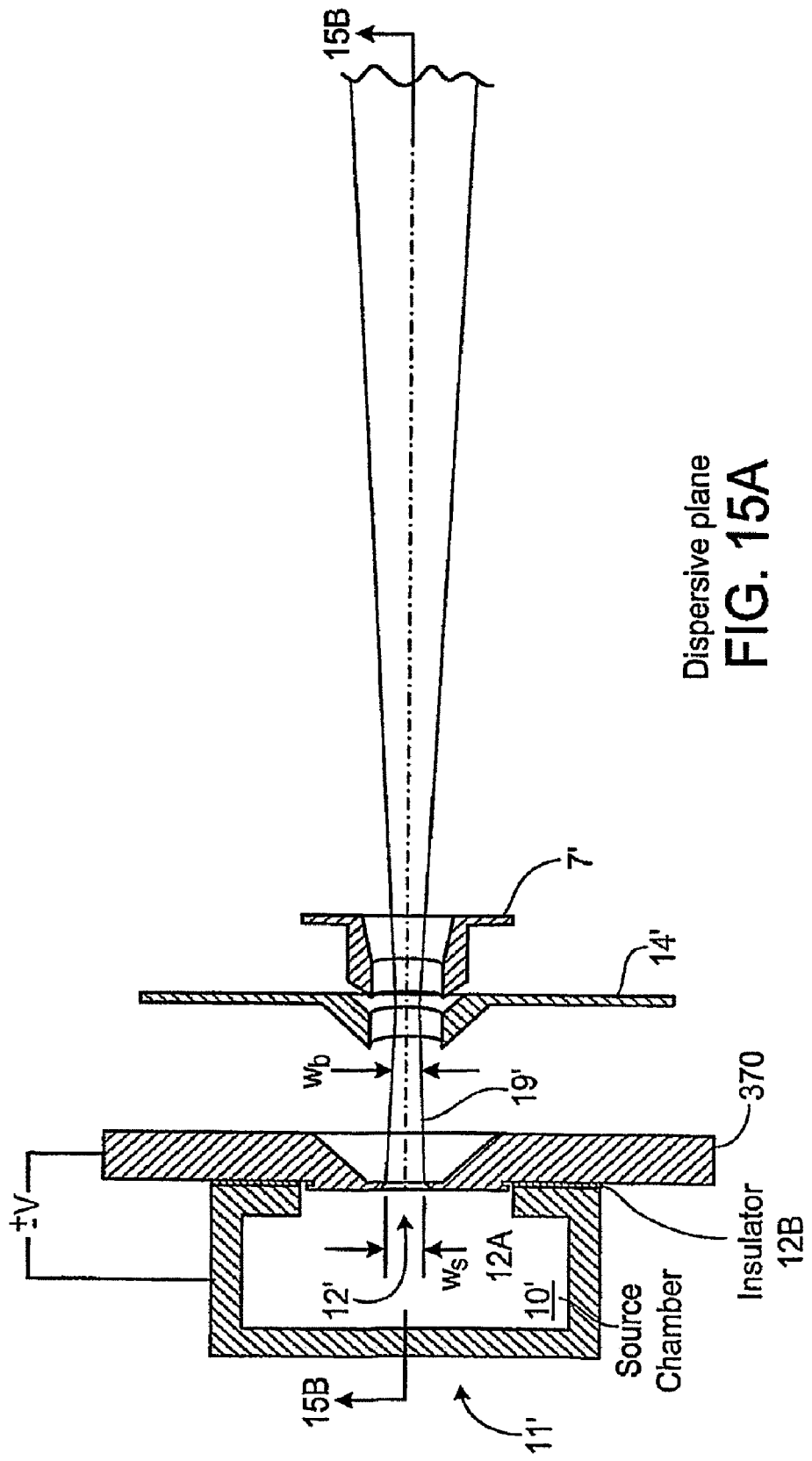
FIGS. 15A and 15B show an ion extraction system associated with the ion source of FIG. 14, respectively in the dispersive and non-dispersive planes of the beam line.

A frequently encountered characteristic of cluster ions, and one that occurs when borohydride ions containing many atoms of a doping species are used, is that ions are produced with different numbers of hydrogen atoms and therefore different masses. Referring to FIG. 9, a high resolution mass spectrum of ions generated by ionizing octadecaborane $B_{18}H_{22}$ vapor in an ion source of the type employing a formed electron beam such as described more fully below with respect to FIGS. 14 and 15A, shows that a range of ion masses occurs, corresponding to the formation of singly charged ions containing different amounts of hydrogen atoms and also different admixtures of the two isotopic boron masses that make up the 18 boron atoms in an ion. From the point of view of achieving a high ion current it is also clear from the spectrum in FIG. 9 that the total number of ions produced is spread over a wide range of mass peaks and therefore it is useful to accept all ions from a mass of about 205 amu to about 220 amu, corresponding to $m/\Delta m \approx 16$. In order to transmit this entire range of masses through resolving aperture 50, the width $w_r$ of the mass resolving aperture needs to be between about 4 to 6 times wider than for the case of implanting conventional ions in semiconductor wafers—e.g. an aperture range between about 8 and 38 mm. A similar consideration applies to ions produced from decaborane $B_{10}H_{14}$, where it is useful to accept ions with masses in the range between about 113 amu to about 123 amu. Because the borohydride masses are much higher in value than masses of unwanted impurity ions, such a wide resolving aperture, with a correspondingly lower mass resolution, is found acceptable. A mass resolving aperture width that is continuously or stepwise adjustable, from a small width for conventional ions to a large width to accept several peaks of borohydride ions, is an important aspect of the embodiments of a multipurpose mass analyzer system. The same considerations generally apply to other cluster ions and specifically to the aforementioned examples of different useful cluster ions.

Referring to FIGS. 10A, 10B, 10C, and 10D, one useful commercial embodiment of a continuously adjustable mass resolving aperture, comprises two geared, contra-rotating, eccentric water-cooled cylinders 140 of stainless steel or other suitable non-ferrous materials. Cylindrical sleeves 142 of graphite fasten over the outside of these cylinders in order to eliminate undesirable heavy metal impurities from being sputtered from cylinders 140 by the incident ion beam 144. (Sleeves 142 of silicon may similarly be employed). Cylinders 140 and their respective graphite sleeves 142 contra-rotate on eccentric centers 143 and 145 creating an axially aligned, adjustable mass resolving aperture width shown at a minimum width 150 in FIG. 10A, and at a maximum width 151 in FIG. 10B after a 180 degree rotation. In one embodiment the minimum aperture width 150 is about 8 mm and the maximum is about 38 mm. Other values and ranges are possible by appropriate adjustment of the cylinder 140 and sleeve dimensions 142, and the location of rotation centers 143 and 145. Cooling water or other suitable fluids can be passed through holes 146 in cylinders 140. Cooling is generally required to remove the heat generated by beam interception, particularly in the case when ion beam 144 comprises high current, high energy, conventional ions. An electric drive motor 148 rotates cylinders 140 through gears 152 and a bearing block and rotating vacuum seal 154. The entire assembly is mounted on flange 156 which can fit and seal into the analyzer magnet vacuum housing 20. A graphite plate 159 with an exit aperture 161 can also serve as the first electrode of a decelerating system to be described below.

The adjustable mass resolving aperture (mass-selection slit) should not be limited to the aforementioned description. One of ordinary skill in the art can appreciate a variety of implementations, including: different geometrical arrangements for cooling, gearing, motor drive and mounting, rotation angles and vacuum sealing; the use of rotating vanes rather than cylinders; and the use of rectilinear rather than rotational motion.

An important aspect of the embodiment shown in FIG. 2 and FIG. 8A is that the poles 26 penetrate through and seal into the vacuum housing 20, an arrangement, which, in effect, maximizes the magnetic efficiency because the space between the poles 26 is not reduced by the presence of the non-ferromagnetic material typically used for the construction of the vacuum housing. The magnetic efficiency is further improved because there is no air gap between the adjacent surfaces of the poles 26 and cores 28. The vacuum housing 20 and poles 26 are sandwiched between the surfaces of the cores 28 but can be easily withdrawn without disassembling the other parts of the magnet, which, in effect, minimizes the cost of maintenance.

Figure 8C:
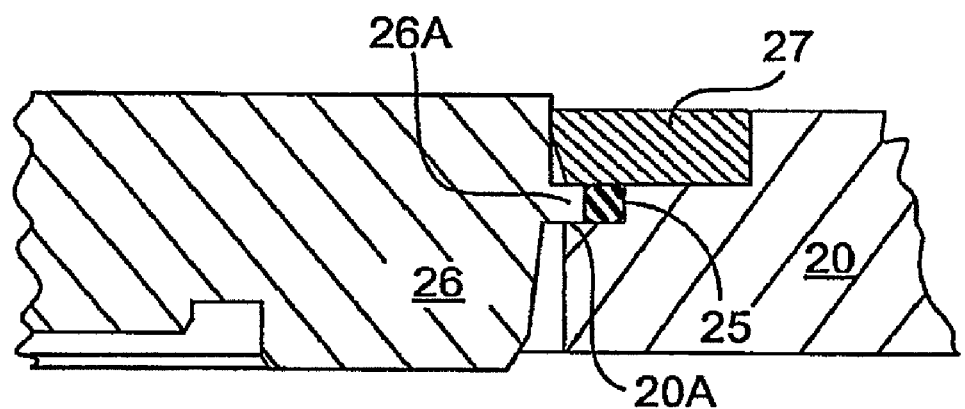
FIG. 8C is a magnified detail of the mounting of a pole.

A sealing arrangement for the poles is shown in FIG. 8C. The pole is provided with a laterally protruding rib 26A extending along each edge of pole 26. Each rib is captured between a ledge 20A formed in the housing wall at the opening for the pole and an overlying retainer strip 27 that is secured to the housing by screw fasteners, not shown. A compressible vacuum sealing element is captured and compressed in a channel formed between the outer edge surface of rib 26A and surfaces of housing 20 and retainer strip 27.

Figure 4:
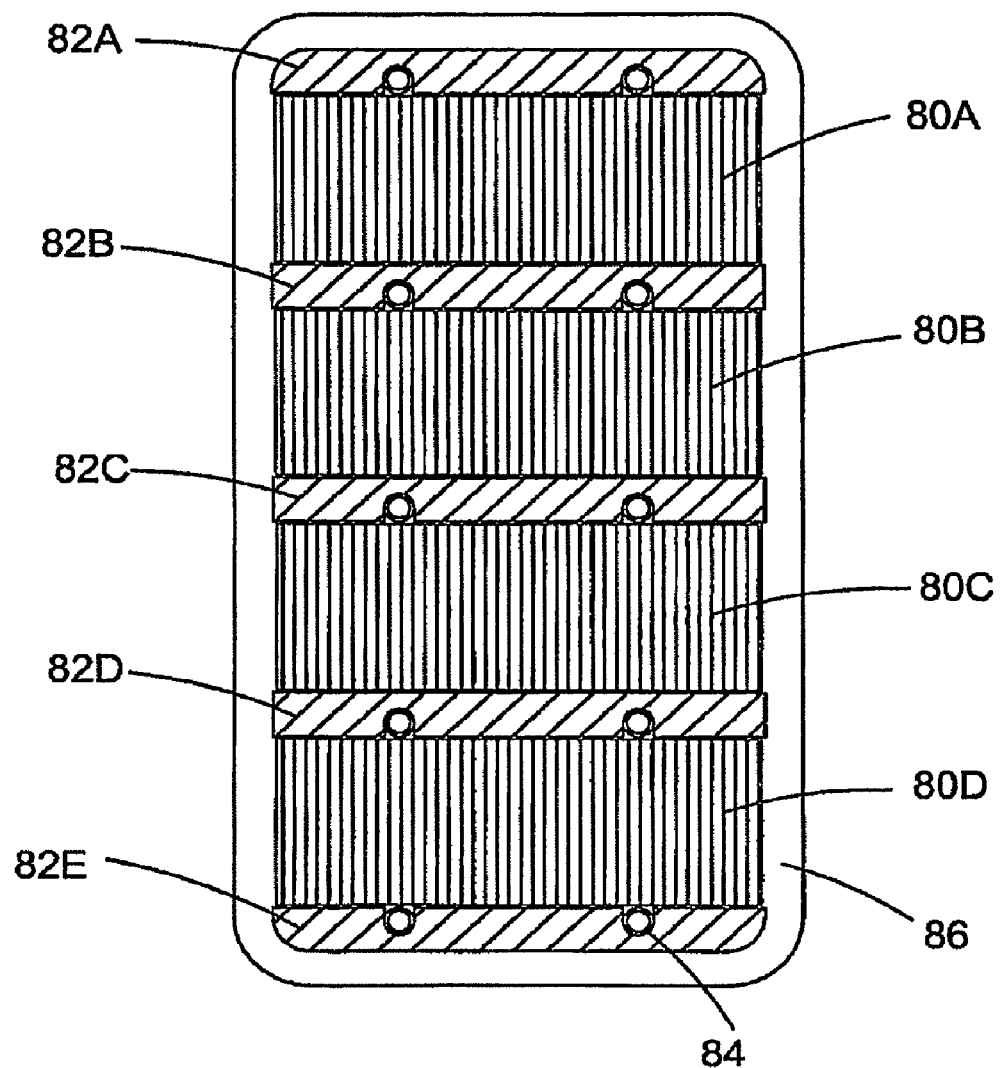
FIG. 4 is a cross section of the high voltage isolated coil of the analyzer magnet.

Referring to FIGS. 1 and 2 the pair of coil assemblies 40 of the dipole magnet is contoured to closely encircle and follow the general plan view shape of the poles 26 and cores 28 in order to minimize the stray magnetic flux outside the working gap between the poles and accordingly minimize the weight and cost of the yoke pieces 30, 32, and 34. In one useful commercial embodiment shown in FIG. 4, coil assembly 40 can include four separate winding elements 80A, 80B, 80C, and 80D, electrically connected in series. Winding elements 80A-D can be, for example, made of 60 turns each of copper strip 1.626 mm×38.1 mm in dimension, and wound continuously with 0.08 mm thick inter-turn electrical insulation. Insulation such as mylar or kapton are suitable. The coil current can be up to 240A and the total voltage across the coil terminals up to 120V dc, corresponding to a total coil power of 28.8 kVA. This is sufficient to generate a magnetic field 24 in the working gap between the poles 26 of greater than 10 kilo-Gauss for a gap dimension of 120 mm between the poles 26.

In one embodiment, three cooling plates 82B, 82C, and 82D are disposed between each pair of adjacently positioned winding elements 80A-D. Outer cooling plates 82A and 82E are positioned on the outer surfaces of winding elements 80A and 80D. Cooling plates 82A-E can have any suitable thickness, for example, 10 mm. Cooling plates 82A-E provide a means for removing or dissipating ohmic heat generated from the electric current passing through winding elements 80A-D. A cooling fluid such as water can be circulated through cooling plates 82A-E via cooling tubes 84, e.g. copper tubes inserted in cooling plates 82A-E. An important aspect of the described structural embodiment is the electrical isolation of cooling tubes 84 from winding elements 80A-D. In the case of water cooling, electrical isolation of cooling tubes 84 from winding elements 80A-D significantly eliminates electrolysis and the need for using de-ionized cooling water—which, in effect, minimizes operating cost and maintenance.

Figure 5:
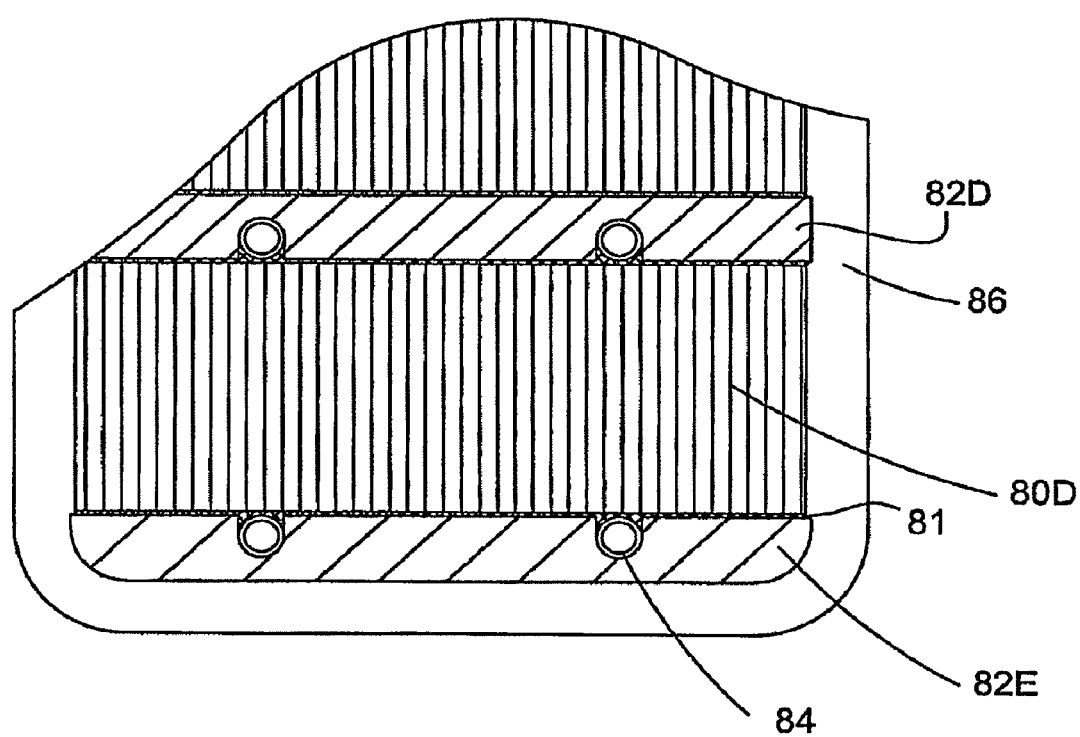
FIG. 5 is an enlarged view of a portion of the coil cross-section shown FIG. 4.

Referring to FIG. 5, in one embodiment, interleaved fiberglass cloth 81 can be used as one means for electrically isolating winding elements 80A-D from cooling plates 82A-E. The entire coil assembly 40 can also be wrapped with fiberglass tape and vacuum impregnated with epoxy resin, to effectuate a single, rigid, impervious coil assembly 40. Coil assembly 40 should possess high integrity against stress generated from thermal expansion and contraction during operation. The resin impregnated fiberglass between the edges of the winding elements 80A-D and the adjacent surfaces of cooling plates 82A-E provide high enough thermal conductivity for efficient transfer of heat which can be 29 kW in one embodiment.

The embodiment of coil assembly 40 should not be limited to the aforementioned description. One of ordinary skill in the art can appreciate a variety of implementations, including: any workable number of winding elements 80A-D and cooling plates 82A-E (for example two, and three, respectively); other suitable materials used for winding elements 80A-D such as aluminum. Additionally, winding elements 80A-E can be made by using rectangular, square, or circular solid copper or aluminum wire rather than strip. In an alternative embodiment, rectangular, square, or circular copper or aluminum tube can be used for the winding elements 80 which can be directly cooled by passing a de-ionized cooling fluid through the hole of the conductor tube, rather than using indirect cooling by thermal conduction to cooling plates 82A-E.

Inter-turn insulation can be implemented by other methods and materials, such as wrapping the conductor with an insulating tape, sliding an insulating sleeve over the conductor, or coating the conductor with an insulating film, e.g. enameled copper or anodized aluminum.

In one embodiment the ion beam is capable of being decelerated after emerging from mass resolving aperture 50. Deceleration can be helpful for the case of low energy, high dose implants because either conventional or borohydride ions can be extracted from the source and transported through the analyzer magnet at a higher energy than the final implant energy. At such higher energy, the effects of internal space charge forces and thermal ion temperature within the beam are less limiting on the magnitude of the beam current that can be realized at the resolving aperture 50. In one embodiment, deceleration is implemented by passing the beam through a sequence of three non-ferromagnetic electrodes 60, 61, and 62, as shown in FIGS. 1 and 3. A decelerating voltage ($V_d$) 64, typically 0-30 kV in magnitude, can be applied between electrodes 60 and 62 to decelerate ions to a lower energy. The decelerator embodiment shown in FIG. 1 can be incorporated in the vacuum housing 20 and the final energy electrode 62 is isolated from the housing 20 with insulator 66. In the presence of the decelerating electric field space charge neutralizing electrons are swept out of the beam. The resulting diverging space charge forces are counteracted by applying a voltage ($V_f$) 65 to intermediate focusing electrode 61 via a feed-through 63 mounted on the vacuum housing 20. The voltage $V_f$ is typically 0-30 kV negative with respect to electrode 62.

The embodiments for the ion decelerator are not limited to the specific arrangement shown in FIGS. 1 and 3, and one of ordinary skill in the art can appreciate a variety of implementations to optimize the ion deceleration for particular incident ion beam conditions, including: any number of workable electrodes (for example two, three, four—etc.); electrodes with circular or slot-shaped apertures; planar or curved electrodes, light or heavy non-ferromagnetic materials such as aluminum, graphite, or molybdenum for constructing the electrodes; and various vacuum configurations wherein the electrodes are installed within the magnet vacuum housing 20 or in a separate vacuum housing depending on the particular configuration of the ion implanter.

When the ion decelerator is activated, the magnet vacuum housing 20, and other parts of the magnet electrically connected to the vacuum housing, such as the poles 26, cores 28, and yoke parts 30, 32, and 34, all must become electrically biased from ground potential by a voltage corresponding to the decelerating voltage $V_d$ (64), i.e. by a voltage in the range of 0-30 kV negative with respect to ground potential.

In one important aspect of the embodiment, the integral windings 80A-D and cooling plates 82A-E are wrapped in porous insulating material such as fiber glass and vacuum impregnated with epoxy to form an impervious cocoon 86 around the entire coil assembly 40 approximately 6-8 mm in thickness. In another embodiment an insulating powder such as aluminum oxide can be used instead of fiberglass to fill the epoxy, and the cocoon formed using a casting mold. The insulating cocoon 86 enables the coil assembly to be electrically isolated by up to a voltage of 30 kV from the remainder of the magnet structure, namely the cores 28, poles 26, vacuum housing 20, and yoke pieces 30, 32, and 34. Therefore, the windings 80A-D and the cooling plates 82A-E can remain nominally at ground potential even though the remainder of the magnet may have up to 30 kV negative bias with respect to ground potential—which, in effect, provides a substantial cost benefit because the coil power supplies 100 (FIG. 2) can be operated at ground potential using standard grounded ac power 102. The embodiment described avoids the need to provide isolation of the coil power supplies 100 to 30 kV. More importantly, it also avoids the need to use a 30 kV isolation transformer for the 30-40 kVA input ac power for the coil power supplies 100. A further advantage lies in the fact that the fluid cooling needed to remove the heat collected in cooling plates 82A-E, for example 29 kW in one embodiment, can be provided from a ground potential source 98 without the need to use a de-ionized fluid. In fact the cooling fluid can be regular non-de-ionized tap water.

Referring to FIGS. 1 and 2, the current terminals 87 for the windings penetrate the cocoon 86 at a location that is typically a distance of 40 mm or greater from any neighboring components of the magnet to enable up to 30 kV electrical voltage isolation to be applied to the coil windings 80A-D and cooling plates 82A-E without arcing and electrical breakdown occurring between the coil terminals 87 and the magnet surround. Similarly, the cooling tubes 88 are brought out through the cocoon 86 in a manner that provides a safe working distance of at least 40 mm from the magnet surround, again to avoid arcing and electrical breakdown. The cooling tubes are welded into manifolds 89 which are constructed with edge and corner radii in order to eliminate electrical coronas. They are also positioned to avoid arcing and electrical breakdown to the magnet surround.

The current leads 90 and cooling lines 92 pass from the coil to a ground surround 96 via insulating PVC sleeves 94 passing through the magnet yoke return 32.

The embodiments for forming the isolating cocoon and bringing winding terminals and cooling tubes outside the coil should not be limited to the aforementioned method. One of ordinary skill in the art can appreciate a variety of implementations including using different types of epoxy recipes and insulating materials.

Referring to FIG. 1, following magnetic analysis, the beam passes through a magnetic quadrupole triplet 210 and finally transported through a beam-line 76 under vacuum to the wafer process chamber 72 to irradiate wafer 70. The wafers are processed serially one at a time, or several at a time by repeated mechanical passage of a batch wafers through the beam. Wafer 70 is admitted from and withdrawn to a clean room area via appropriate electromechanical mechanisms, doors and vacuum locks.

The embodiments of the beam-line and process chamber are not limited to a particular configuration. For example, as one of ordinary skill will appreciate, the beam-line may be simply a ballistic drift region, or it may have a number of other features including: ion optic elements such as a bending magnet to filter out neutral particles generated in the case when the beam is decelerated prior to entering quadrupole triplet 210— such neutral particles have a higher energy than the decelerated ions and if they are not filtered out of the beam they are more deeply implanted in wafer 70 which can significantly degrade semiconductor device performance. Beam line 76 may also contain magnetic or electric beam scanners, with associated collimator magnets, to parallel scan the beam in one direction across the wafer. This can be advantageous in a commercial implanter because then the wafer only needs to be mechanically scanned in the orthogonal direction to the beam scan direction to finally achieve a uniform dose.

Figure 12B:
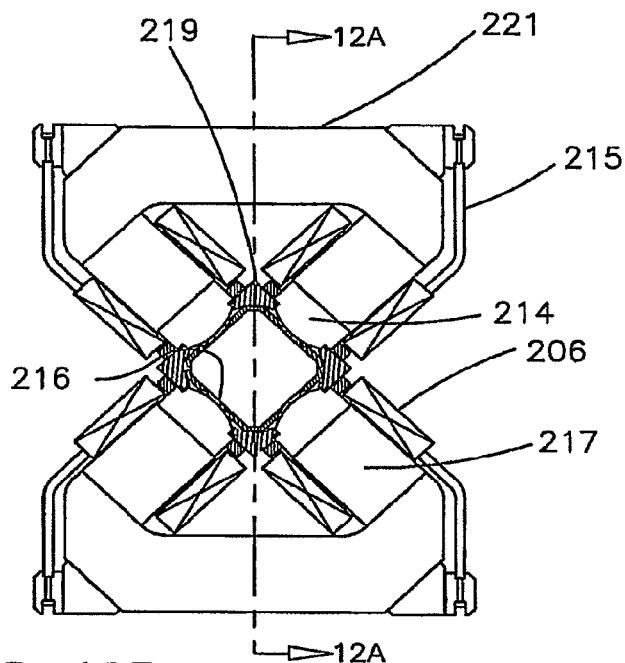
FIGS. 12A and B show a magnetic quadrupole triplet in longitudinal and transverse cross-section, respectively.
Figure 12A:
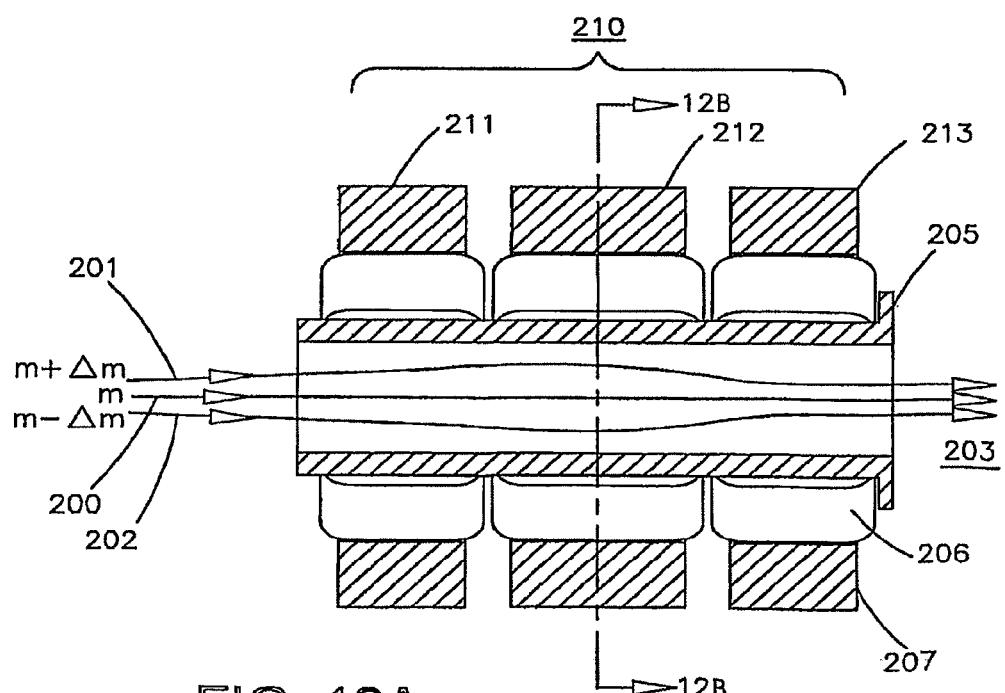

Referring to FIG. 12A, the magnetic quadrupole triplet 210 is useful in commercial ion implanters, for the cases of both conventional and cluster ions, irrespective of the details of the components in the downstream beam-line 76. Firstly, the strength of the magnetic fields of the three individual elements 211, 212, and 213, of the quadrupole triplet can be independently adjusted to control the dimensions and angular divergence in both the vertical and horizontal directions of the beam at the wafer 70 and thereby optimize the beam implant conditions on wafer 70. This is important in a commercial ion implanter in order to achieve high quality implants, especially as the downstream components in the beam-line usually do not have readily adjustable, broad range, focusing capability. Secondly, in the cases where prior deceleration of the ion beam occurs, the quadrupole triplet is also useful to control the beam divergence that often occurs, at least in one direction, following the deceleration process. In one common embodiment the beam entering quadrupole triplet 210 is ribbon shaped with the long direction in the vertical direction. In this case the first element 211 is operated with a polarity that causes focusing in the vertical direction, with corresponding defocusing in the horizontal direction. The second element 212 has polarity opposite to 211 causing horizontal focusing and vertical defocusing. Finally, the third element 213 has the same polarity as the first element 211. The focus (F) and defocus (D) combinations are therefore DFD in the horizontal plane and FDF in the vertical plane. By using appropriate field strengths in each of the elements 211, 212, and 213, respectively, overall net focusing is simultaneously achieved in both vertical and horizontal planes.

Very importantly, in the case of the cluster ions, when mass resolving aperture 50 is set wide enough to transmit a range of ion masses, for example, from between about 205 amu to 218 amu for the case of octadecaborane, or from between about 108 amu and 115 amu for the case of decaborane, the individual magnetic field strengths of the quadrupole elements of the triplet can be adjusted to simultaneously and substantially remove angular deviation at wafer 70 that can otherwise generally occur in the case where there is a range of different masses in the ion beam. Referring to FIG. 12A selected, ions of mass $m \pm \Delta m$ enter the quadrupole along horizontal paths that are displaced and at slightly different angles from the central ion path corresponding to an ion mass m. As described previously, in connection with FIG. 1, these separations are generated as the multiple mass ions are transported through the analyzer magnet. By appropriate adjustment of the DFD focusing sequence, the ion paths 203 emerge from the quadrupole approximately parallel to each other. Eliminating such angular deviation is important commercially because it enables high currents of cluster ions to be used in low energy, high dose implant applications, without deteriorating the implant angle quality on wafer 70 as a result of there being more than one ion mass in the beam impinging on the wafer.

When one or more mass dispersive elements are in the beam line beyond the quadrupole triplet, the differential adjustments of the triplet can compensate for the mass dispersive effects of these downstream elements as well as that of the analyzer magnet for the entire range of different mass cluster ions.

Referring to FIGS. 12A and 12B, in one embodiment the quadrupole magnetic fields are generated by passing electric current through coils 206. Each quadrupole element has four coils wound separately around four ferromagnetic core pieces 217. The core pieces fasten to ferromagnetic pole pieces 214 which penetrate and seal through vacuum housing 219 constructed from non-ferromagnetic material such as aluminum or stainless steel. Adjacent coils are wound with opposite polarity in order to create a so-called quadrupole field in the region between the four poles. Magnetic flux is returned from one pole to another via core pieces 217 which are magnetically coupled via ferromagnetic yoke structures 221. The windings of coil 206 are made from rectangular section copper tube 215 which are directly cooled with water or other suitable cooling fluids. Graphite liners 216 prevent beam strike from sputtering heavy ion contaminants off surfaces of poles 214, and the internal walls of vacuum housing 219.

The quadrupole structure should not be limited to the aforementioned description of FIGS. 12A and 12B, and one of ordinary skill in the art can appreciate a variety of implementations, including: using two rather than three elements to provide DF and FD sequences to obtain overall focusing in the vertical and horizontal planes; and the use of electrostatic rather than magnetic quadrupole fields.

Figure 13:
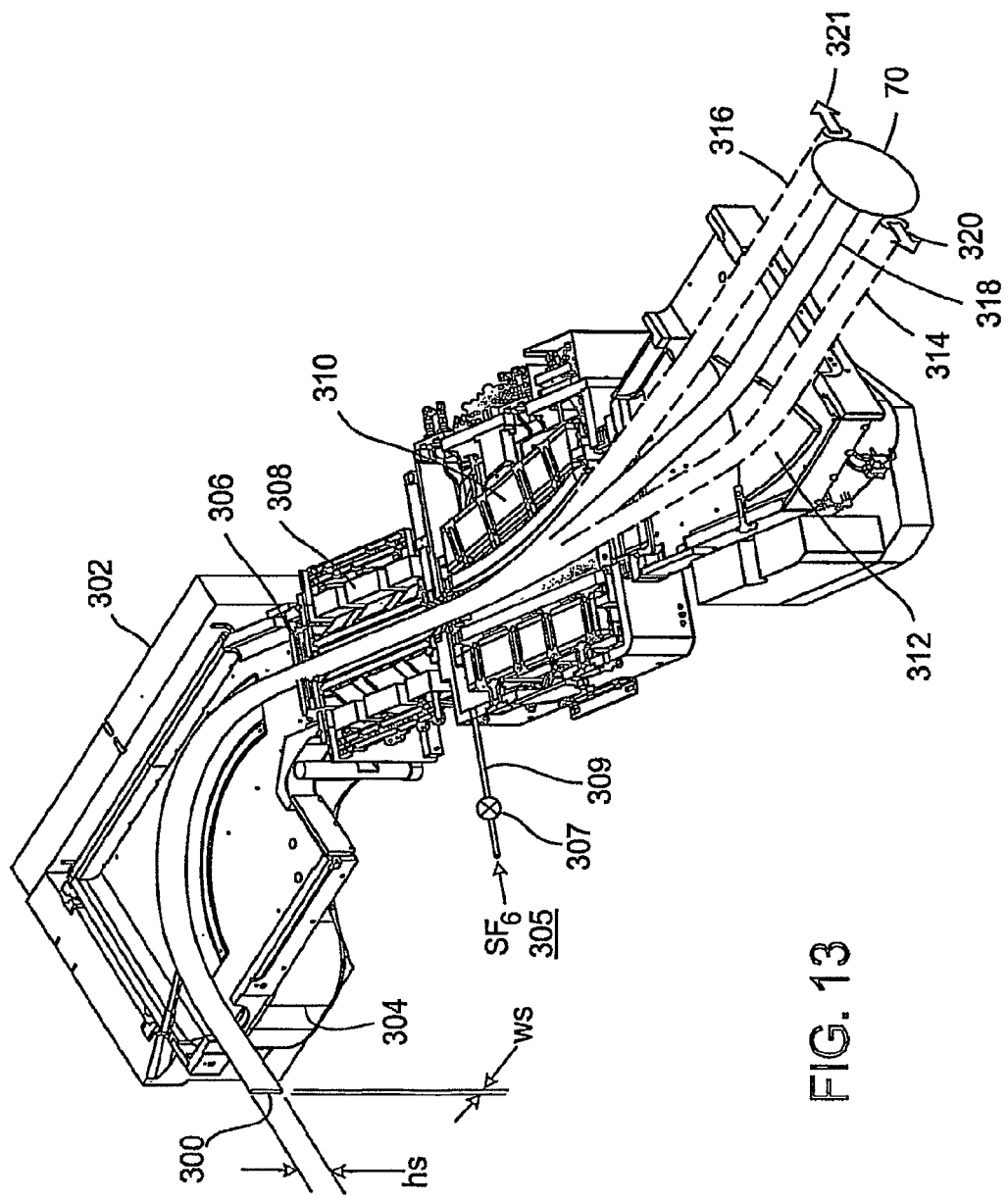
FIG. 13 shows a perspective view of a median plane cross-section of a magnetic scanning-beam line.

One embodiment, suitable for ion implanting with cluster ions as well as conventional ions, and employing a magnetic scanning beam-line is shown in FIG. 13. A ribbon shaped beam 300 is extracted from an ion source with an aperture width $W_s$ of 12.5 mm and a height $h_s$ of 100 mm, such as described in association with FIG. 1. The beam is magnetically analyzed with a 120 degree sector bending magnet 302 having isolated coils 304 as previously described and shown in FIGS. 2, 4 and 5. The pole shape has pole edge shimming as shown in FIGS. 8A and 8B and as previously described. The beam passes through an adjustable mass resolving (selecting) aperture as shown in FIGS. 10A-D, a three electrode decelerator unit 306 as shown in FIG. 3 and a magnetic quadrupole triplet 380 as shown in FIGS. 12A and 12B. The beam then passes through a magnetic scanner 310 and collimator 312 which collectively parallel scans the beam in a horizontal direction from one side 320 to the other side 321 across wafer 70. Referring to FIG. 13, a schematic illustration is shown of the beam 314 on one side of the wafer, 318 at the center of the wafer, and 316 on the other side. An important aspect of the embodiment is the fact that the beam scanner and the collimator both bend the beam in the same sense. Consequently, the ion beam path lengths and magnetic focusing properties of combined scanner and collimator are similar for the three beam positions 314, 318, 316. Consequently, irrespective of the horizontal scan position of the beam on the wafer, one set of field strength settings can be found for the three magnetic quadrupole elements which simultaneously optimize the beam size, angular spread, and, very importantly, eliminate angular deviations in the case when multiple mass borohydride ions and cluster ions in general are used.

In one useful commercial embodiment of the beam-line shown in FIG. 13, the previously described beam line parameters have the following values:

A. Analyzer Magnet: R=500 mm, $\phi$=120°; G=118 mm; $s_1$=31 mm; $s_2$=8.6 mm; $h_1$=8.7 mm; $h_2$=4.7 mm; W=166 mm; bending power=80 keV octadecaborane, accepting ions from source aperture $w_s$=2.5 mm and $h_s$=100 mm.

B. Mass selection aperture: about 8 mm minimum to about 38 mm maximum, continuously adjustable.

C. Decelerator Electrodes; three planar with aperture sizes 50 mm wide×118 mm high.

D. Quadrupole triplet: aperture: 80 diagonal between pole tips; pole tip field adjustable 0-5 kGauss.

E. Beam Scanning Magnet; Vertical gap=80 mm; Bending power=80 keV octadecaborane.

F. Collimator: Bending radius 900 mm; Pole gap=80 mm; bending power=80 keV octadecaborane.

The total deflection produced collectively by scanner 310 and collimator 312 is 30 degrees. The bend direction is opposite to the bend direction of the analyzer magnet in order to minimize the width of the ion implanter, which is an important consideration that in effect reduces cost and installation footprint.

The beam size and angular divergence at the wafer are controlled by differentially adjusting the strength of the individual quadrupole elements in the quadrupole triplet. Importantly, in the case of the borohyride ions and cluster ions in general, the triplet also compensates for the collective mass dispersion introduced by the analyzer magnet, magnetic beam scanner, and magnetic collimator. By appropriately setting the quadrupole element strengths, the angular deviation arising from the multiple mass components can be substantially removed, i.e. reduced to less than 0.15 deg over the entire scan range.

High energy particles remaining in the beam after deceleration following the mass selection aperture do not reach the wafer because they are filtered out of the beam by the combined beam deflections of the scanner and collimator.

Figure 14A:
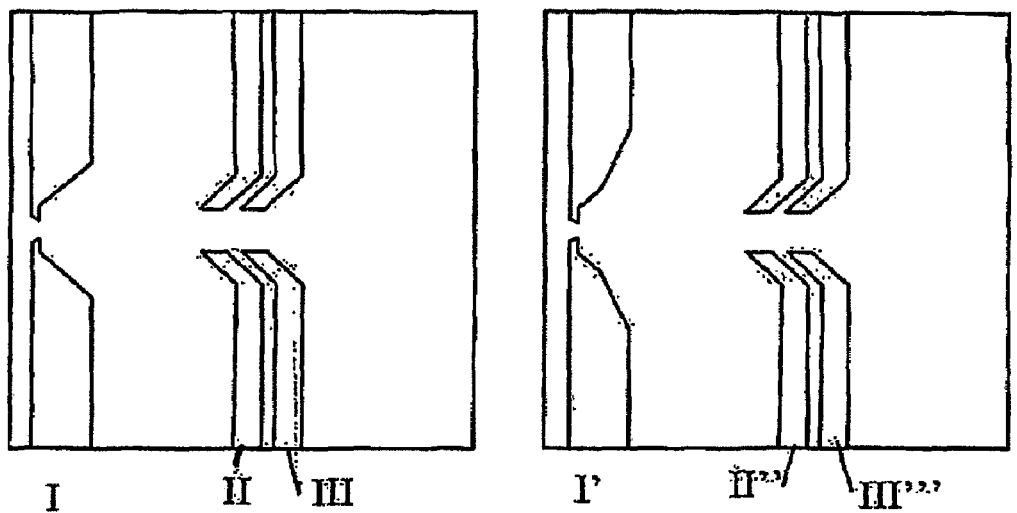
FIG. 14A is a diagrammatic example of other useful electrode shapes of an ion source useful in the embodiments of FIGS. 1 and 13.

The ion source 11 of FIGS. 14 and 14A for use in the embodiments of FIGS. 1 and 13 produces cluster ions, for example the borohydride ions $B_{18}H_x^+$ or $B_{10}H_x^+$ from $B_{18}H_{22}$ or $B_{10}H_{14}$ vapor. As explained previously in reference to FIGS. 1 and 6, and as shown in greater detail in FIGS. 14 and 15B for this embodiment, the ions are extracted from an ionization chamber by an electrostatic extraction electrode system comprising a suppression electrode and ground electrode, the ions being drawn through an extraction aperture 12 in the form of a vertically-oriented slot in the front plate of the ion source body having width $w_s$ and height $h_s$. The dispersive plane for the ion beam line is in the direction of width $w_s$ in FIG. 15A, while the non-dispersive plane is in the direction of height $h_s$ in FIG. 15B.

FIG. 14 shows dispersive plane cross sections of two variations of the cluster ion beam extraction system. The extraction system consists of three plates: The ion extraction aperture (I), through which the ions are extracted from the ion source at source potential (e.g., 60 kV above terminal potential), suppression electrode (II) typically held a few kV below terminal ground potential to suppress any backstreaming electrons, and ground electrode (III), held at terminal potential.

Extraction aperture plate (I) is about 20 mm thick. The flat section adjacent to the extraction aperture is identical for both variations (I). In the first case, the bevel has a uniform angle throughout the thickness of the plate, whereas in the second case, there is a double bevel of increasing angle.

The system of either design is adjustable over a wide angle.

The embodiment of FIGS. 14, 14A, 15A and 15B utilizes a formed beam 330 of accelerated electrons to produce cluster ions within ionization chamber 10'. This type of ion source produces a sufficient density of molecular ions to enable the extraction electrode 14' to extract a current density of up to about 1 mA/cm² from the slot aperture 12' machined in front plate 370 of the ion source body. In a preferred embodiment for use in FIGS. 1 and 6 the slot dimension is about 100 mm high, $h_s$, by 12.5 mm wide, $w_s$. Slots of greater or lesser dimensions will yield a correspondingly greater or lesser amount of total extracted ion current, with substantially similar peak extracted current density.

Using principles previously described by T. Horsky, the ion source 11' of these figures uses impact of energetic electrons of beam 330, FIG. 14, to provide the gentle ionization necessary to preserve the integrity of the vapor molecules being ionized. Such an ion source, when constructed to provide good beam current performance using vapors of borohydride feed material, also is capable of producing several mA of arsenic and phosphorus ion beams from arsine and phosphine gas, using a traditional gas box and gas feed to the ionization chamber 10'. The ion source of FIG. 14 employs a remotely positioned electron gun 340 that comprises a filament and electron optical system external to the ionization chamber 10' to produce the formed beam 330 of accelerated electrons. Filament wear associated with ion erosion is thus minimized, helping to ensure long filament life. The externally generated, energetic electron beam 330 creates a region of ions just behind the long rectangular slot 12' along its entire length from which ions are extracted by the ion optical system. For this purpose, the electron gun 340 creates an electron beam of between 1 mA and 100 mA. The beam is deflected through 90 degrees by a magnetic dipole field. Once deflected, the beam is injected into ionization chamber 10' to traverse a vertical path parallel to the length of the extraction slot aperture 12'. The electron beam is confined to this path by vertically-oriented magnetic field 350, the magnetic confinement being optimized for each design to maximize the ionization efficiency of the injected electron beam. After passing behind the extraction aperture 12', the unused portion of electron beam 330 is intercepted by beam dump 360.

By varying the electron emission current and also the flow of feed material into the ion source 11, a stable electrical ion beam current of between 5 μA and 3 mA can be achieved. As an example, $B_{18}H_{22}$ or $B_{10}H_{14}$ vapor is typically introduced into the ion source from an externally mounted heated vaporizer, through a pressure control device which regulates the flow of vapor into the ionization chamber 10'. For feed material in the form of source gases such as arsine and phosphine a separate gas feed passage is provided to the ionization chamber.

Advantages of such a large gap beamline system, even when employed with conventional ions, include larger total beam current and better transport of the beam. By use of the large extraction aperture, and extraction at lower ion density, Child-Langmuir limits on ion beam current density are avoided and larger total beam current can be extracted for transport through the large gap system. Also, because of the lower ion density, and hence lower charge density in the extracted ion beam (relative to that of a conventional Bernas-type source), the beam blow-up caused by internal Coulomb space charge forces is reduced. This enables the ion beam to reach the target with less angular divergence, and improved uniformity of angle of incidence upon the target surface. Space charge forces as well as thermal motion still cause the extracted ion beam to tend to expand in both the dispersive and non-dispersive directions. The ion optical extraction system of FIGS. 15A and 15B is constructed to effectively form and focus the ion beam in the dispersive and non-dispersive planes by application of lens voltages.

FIG. 15A shows the front plate 370 of ion source chamber 10', extraction slot aperture 12' formed in the plate, suppression electrode 14', and ground electrode 7', all in horizontal cross-section, with the dispersive plane in the plane of the figure. In the dispersive plane, the ion beam 19' is focused at $w_b$ into the acceptance of the analyzer magnet 21 of FIG. 1. The position of the electrode elements 7' and 14' with respect to the aperture plate 370 of the ion source along the beam direction is variable by motion control devices which are known in the art.

Figure 15B:
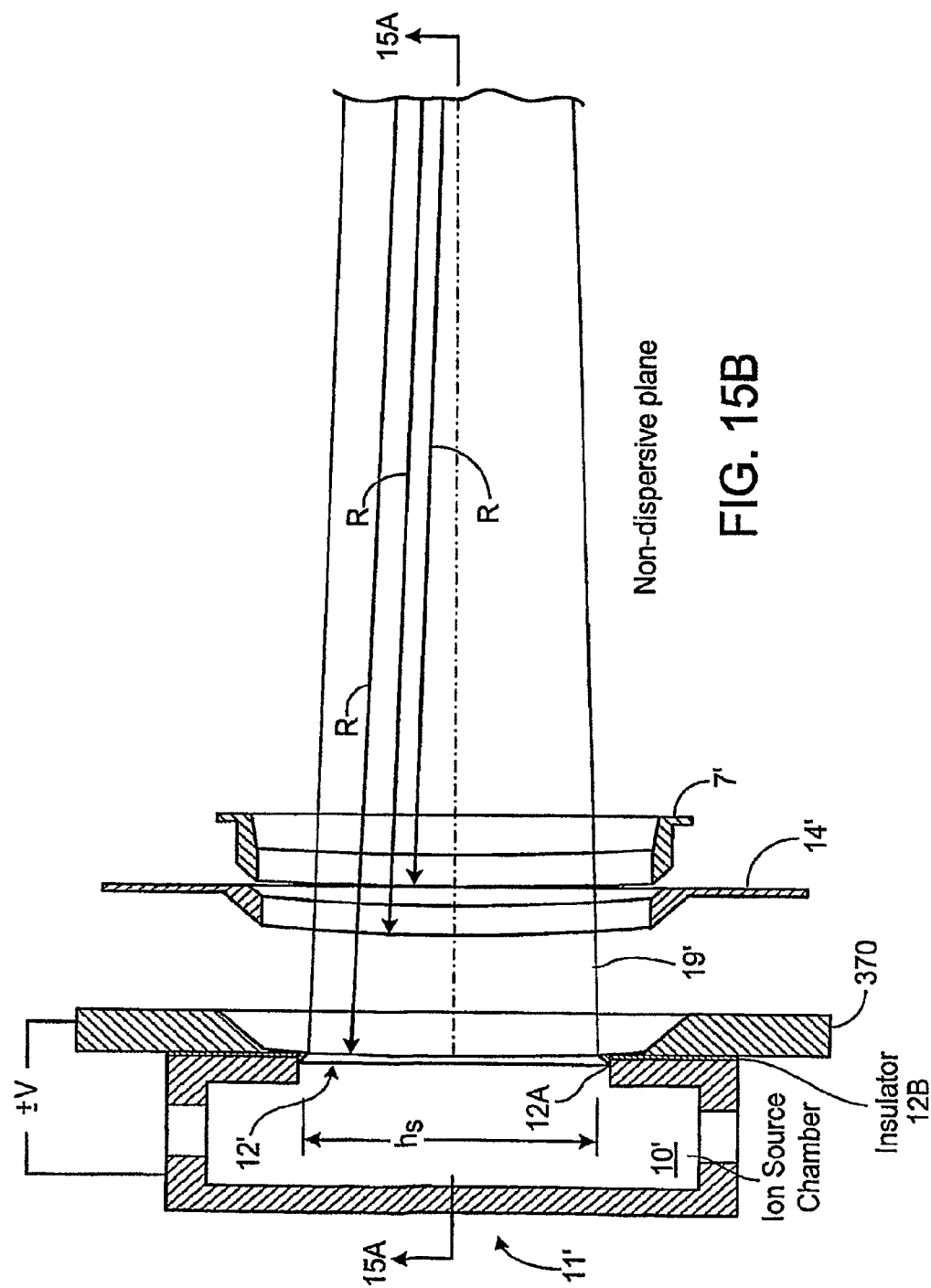

In this preferred embodiment, as shown in FIGS. 15 and 15B, the front plate 370 of the ion source chamber 10' is formed as a knife edge 12A at the slot aperture 12' to also serve as an adjustable lens element. For this purpose the aperture plate 370' is electrically isolated by insulator 12B from the remainder of the ion source body as previously described by T. Horsky, et al.

Figure 16A:
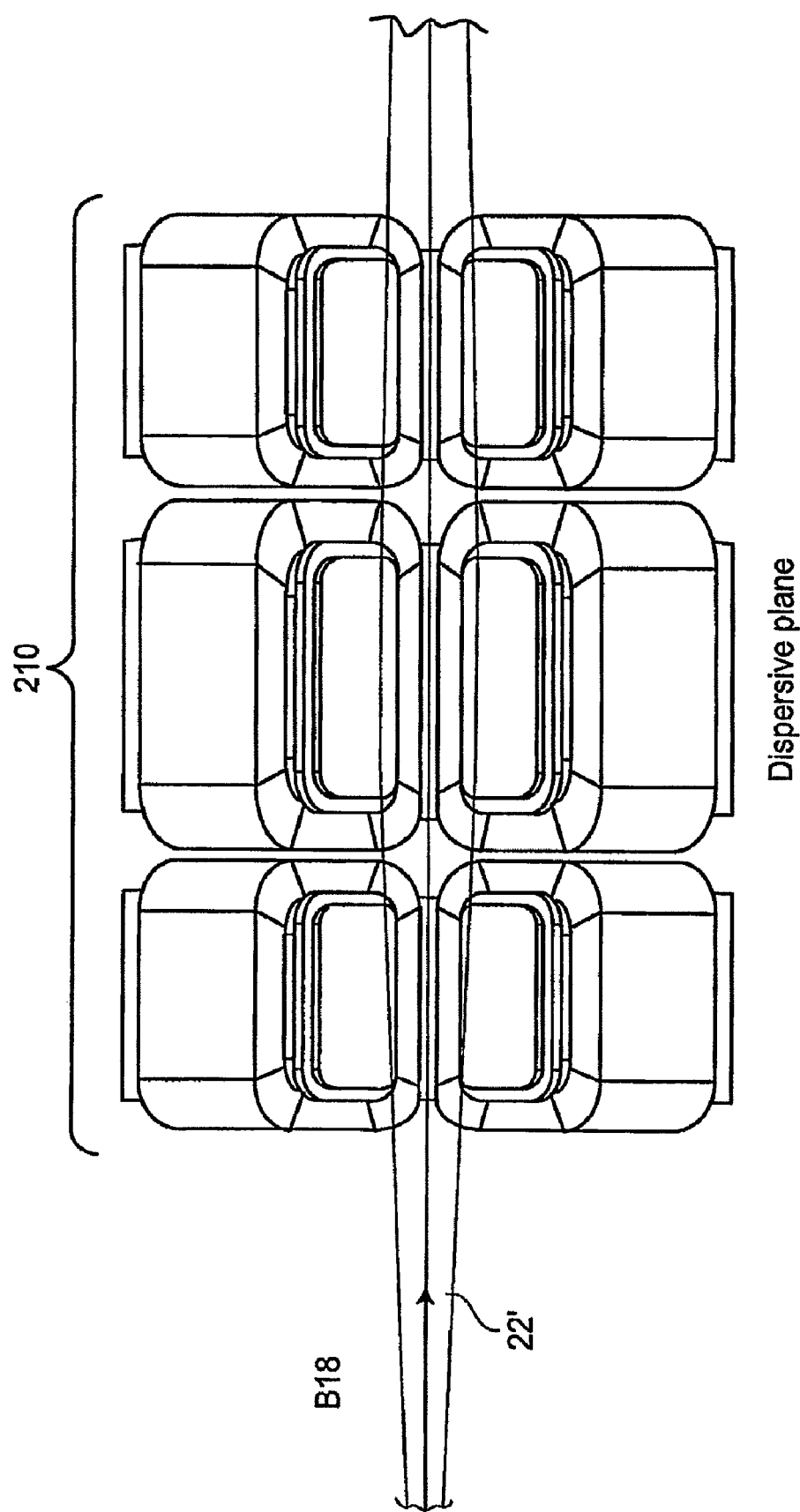
FIGS. 16A and 16B show the ion beam envelope through the quadrupole triplet of FIGS. 12A and 12B, respectively in the dispersive and non-dispersive planes of the beam line.

The focal length of this lens system in the dispersive plane for producing the beam waist $w_b$ is dictated by the beam energy and the position of the electrode elements, as well as by their shape and applied voltages. As previously described, the beam 22 is then focused by the analyzer magnet to form a conjugate image in the dispersive plane of width $w_r$ at the mass selection aperture 50, as described in relation to FIG. 3, following which the beam 210 reaches the quadrupole triplet with appropriate size to enter the triplet. The typical beam envelope in the horizontal plane passing through the triplet 210 is represented in FIG. 16A for the case of the central mass peak. The separation and principal ray paths for the range of mass peaks has previously been described in FIG. 12A.

In the systems of FIGS. 1 and 13, focusing in the "Y" (non dispersive) plane to the quadrupole triplet 210 is accomplished by the extraction optics of the ion source as no "Y" direction focusing occurs in the analyzer magnet. In the embodiment of FIG. 15B, to focus the ion beam in the non-dispersive plane, the suppression and ground plates 7' and 14', as well as the knife edge 12A of the extraction slot 12', are fabricated with a radius of curvature, such that each presents a convex profile to the ion source, and a concave profile to the downstream beam line. This curvature, as shown in FIG. 1B, produces convergence of the height of the extracted beam 19'. In the embodiment, a radius of curvature R of 1 meter is employed. In other embodiments other radii are possible; in general, smaller radii applied to the extraction plates produce a shorter non-dispersive plane focal length, and hence a greater degree of convergence, and vice versa with respect to larger radii. By use of the triode thus formed, simple and space-efficient focusing in the non-dispersive plane is thus accomplished and, referring to FIG. 16B, the analyzed beam 22' reaches the quadrupole triplet 210 within an envelope sized in the non-dispersive plane to enter the triplet 210.

The degree of beam convergence produced by the extraction optics of the ion source in the non-dispersive plane of the analyzer magnet varies with the magnitude of the total cluster ion beam current and the ion energy and is optimized to size the beam to be accepted at the entrance to the quadrupole over a wide range of beam currents from a few microamps to a few milliamps, and a wide range of energies, from about 4 keV to 80 keV. The quadrupole triplet provides final optimization of the beam size and angular divergence at the wafer in both the non-dispersive (vertical) and dispersive (horizontal) planes at the wafer 70.

The embodiment of a system for non-dispersive plane focusing of the beam prior to the analyzer magnet, however, are not limited to a particular configuration. Systems are possible in which the aperture plate does not serve as a lens element, or additional lens elements may be employed, or a quadrupole focusing element may be included.

Figure 16B:
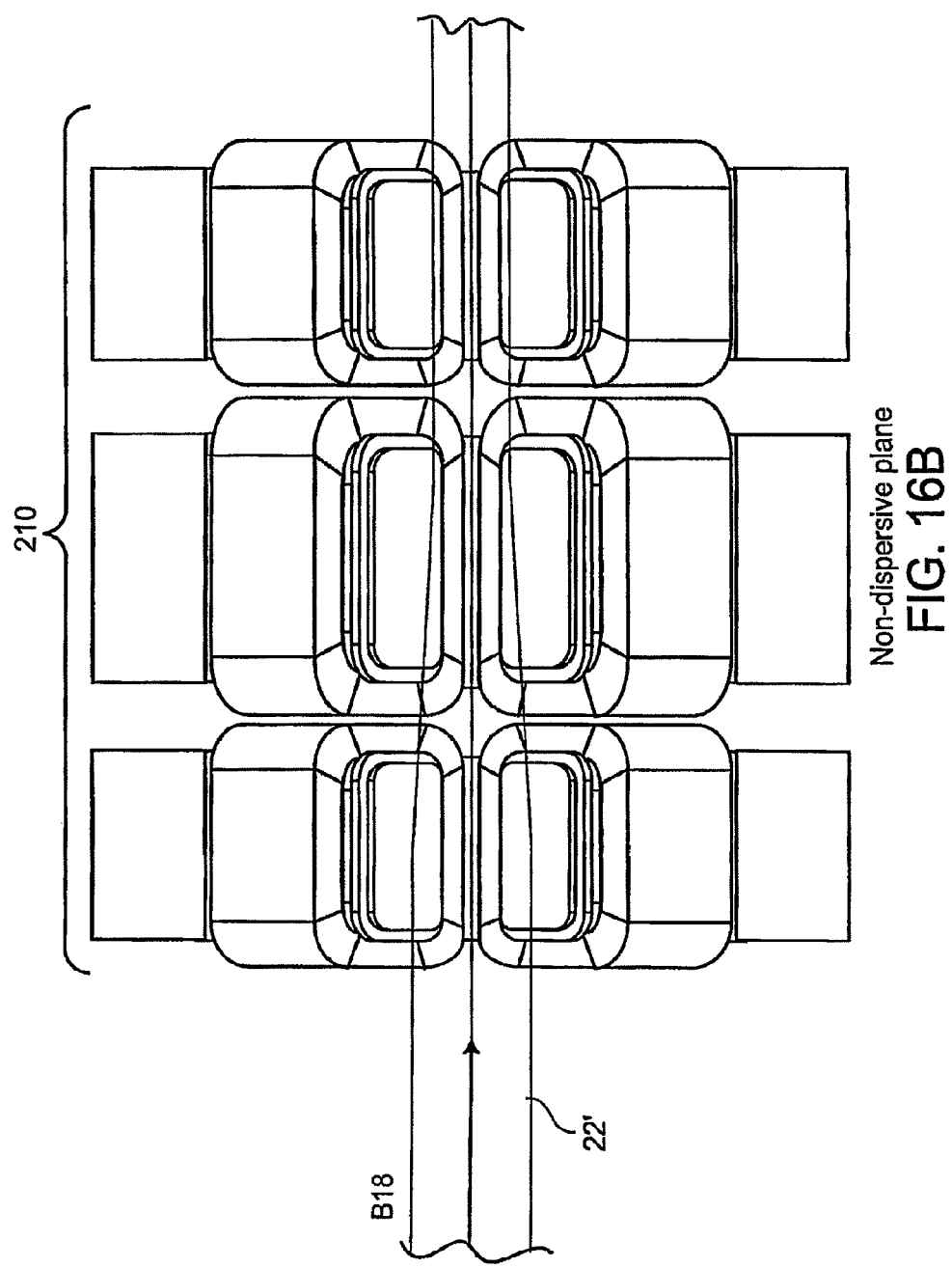

By providing non-dispersive plane focusing by an optical system preceding the analyzer magnet, the demands upon the analyzer magnet design are simplified while providing highly efficient ion beam transmission through the analyzer magnet and the post-analysis quadrupole triplet 210. Along with the reduced divergence obtained with low density ion extraction, this tends to reduce strike of ions on the passage walls, leading to fewer detrimental deposits, greater useful beam current and less contamination of the beam. As shown in FIG. 16B, a thus-produced, well-collimated beam with a vertical height of about 6 cm can be injected into the quadrupole triplet with the non-dispersive plane focusing shown, even though the beam was generated from an extraction slot of 10 cm. height.

Figure 17:
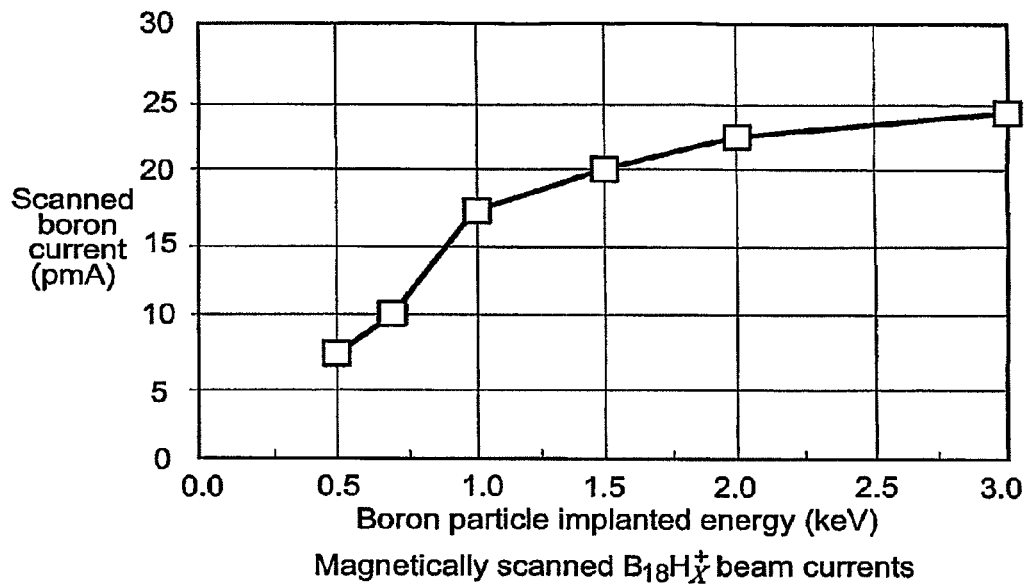
FIG. 17 is a plot of particle boron beam current against implant energy measured during operation of a system corresponding to FIG. 13.

FIG. 17 shows magnetically scanned boron particle currents, derived from octadecaborane, employing the scanning system according to FIG. 13 and the ion source according to FIGS. 14, 15A and 15B. The current was measured at the exit port of the vacuum housing of collimator 312 in FIG. 13. The beam current was essentially unchanged over the entire scan sweep frequency range from dc to 170 Hz. These measured particle beam currents are very much higher than hitherto reported from conventional fixed beam, high current ion implanters. Furthermore, these beam currents were achieved without the need to use deceleration just prior to the wafer, a technique often used in conventional high current implanters to enhance the low energy beam current but having the disadvantages of (a) introducing large angular spreads of several degrees in the ions impinging on the wafer, and (b), allowing high energy particles neutralized prior to or during deceleration to reach the wafer, in the absence of neutral particle filtering after deceleration. Such high energy particles penetrate further into the wafer and generally degrade the implant quality, which is undesirable for the production of present-day very shallow CMOS junctions.

It is well known that it is very difficult to extract and magnetically analyze from a Bernas type ion source, very high beam currents (more than 5 mA) at low energy (less than 10 keV) of monatomic doping ions such as $B^+$, $P^+$, and $As^+$. Even if high currents can successfully be extracted from the source itself, the injection into and transport around the magnetic analyzer proves to be difficult because at low energies the ionization cross-section for the ions to form space charge neutralizing electrons within the ion beam is very small and falls very rapidly with decreasing energy below the energy regime of 10-15 keV. Attempts to improve the beam neutralization by directly inserting electrons into the beam, or introducing them via a plasma gun are generally thwarted by the very presence of the magnetic field of the analyzer itself and are therefore techniques generally not of benefit to commercial ion implanters.

Yet another well known technique is to bleed a gas or vapor into the region inside the vacuum housings of the ion source and/or analyzer magnet and thus flood the beam path with a higher pressure of gas in the hope of generating more space charge neutralizing low velocity negative ions within the beam. $P^+$, and $As^+$ ion currents have been moderately increased with a gas bleed of nitrogen, but this generally reduces the $B^+$ ion current. Sinclair et al. (U.S. Pat. No. 5,814,819 Sep. 29, 1998) has found that water vapor can enhance the monatomic boron current that can be extracted from a Bernas type ion source and transported through the analyzer magnet. These methods of neutralization have not been widely successful or adopted in commercial implanters because the high beam currents at low energy generally exceed the physical conditions of plasma stability particularly in the presence of the analyzer magnetic field. Consequently, the generated ion beams are often unstable, the instabilities being trigged by small statistical fluctuations in the beam size and current being extracted from the ion source. The beam currents are often not reproducible and can depend too critically on the precise ion source parameter tuning and changes associated with temperature variations.

An advantage of the cluster type ion source represented in FIGS. 14, 14A, 15A, and 15B is that additional background gas neutralization is not generally required because the actual cluster ion beams are at a much higher energy and a much lower current than for the case of comparably useful monatomic ion beams, and as a consequence the conditions that lead to plasma instability are avoided.

In the case of a long beam line as represented in FIG. 13, where the path length from the exit of the analyzer to the wafer is greater than 2 m and even as long as 3 m in order to accommodate the beam line quadrupole, scanning magnet, collimator magnet, and a 0.5-0.7 m drift through the final process chamber, it has been found useful at low energies wherein the ion beam is not fully neutralized with electrons and wherein the beam has to pass through magnetic fields such as the scanner and collimator, to add a small amount of electronegative gas such as $SF_6$ in the scanner and collimator regions to improve the beam transmission to the wafer and reduce the beam size at the wafer, both of which result in improved wafer throughput and implantation efficiency.

Referring to FIGS. 13 and 17, at single particle implant energies below about 1 keV the beam current on the wafer can be significantly enhanced by a factor of 1.5-2 by admitting a small amount of $SF_6$ gas 305 into the vacuum housing of the sweep magnet 310 via a flow control valve 307 and a tube 309. This is because $SF_6$ readily forms negative ions within the cluster ion beam via interaction with the cluster ions. Such negative heavy ions have a low mobility and being energetically trapped within the electric potential well of the beam are effective in neutralizing the internal space charge forces within the beam that otherwise would cause the beam to blow-up beyond the acceptance aperture of the beam line. The presence of $SF_6$ also significantly reduces, by 50-70%, the transmitted beam size at the wafer as a result of reducing the beam blow-up in the drift region between the exit of the collimator 312 and the location of the wafer 70. Typical flow rates of $SF_6$ needed to enhance the beam current are 0.1 standard cc per minute producing a pressure rise of only 2-3E-6 torr. $SF_6$ is a relatively inert gas and its use at such a low pressure is thought not to be generally detrimental to implant processes either directly or via interaction with the cluster ion beam itself.

Figure 17A:
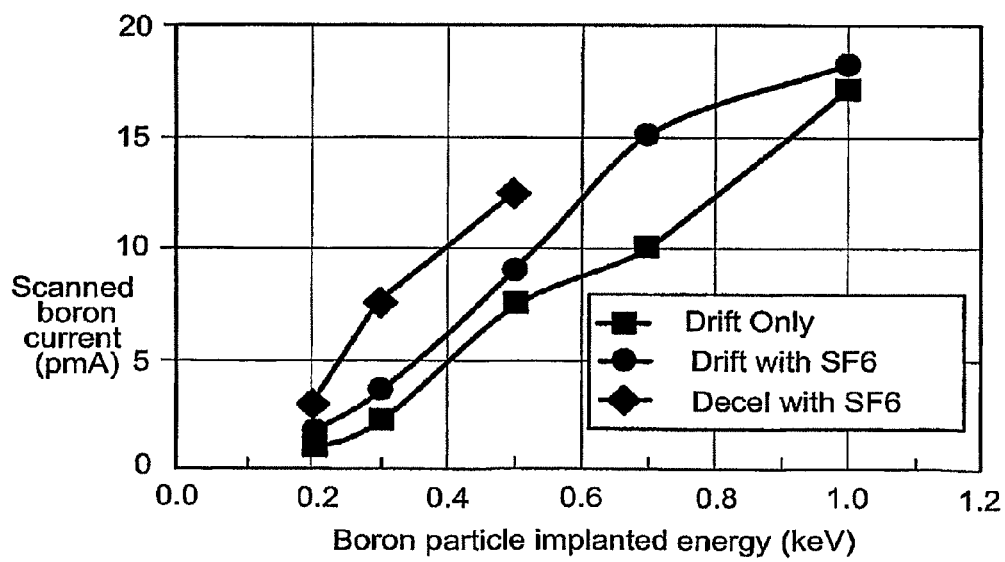
FIG. 17A are plots of the particle boron beam current against implant energy using $SF_6$ and deceleration.

Referring to FIG. 17A, below 1 keV and especially below 0.5 keV, the beam current is further enhanced in the embodiment shown in FIG. 13, by activating the three electrode decel system 306 shown in FIG. 3. At optimum operation the decel ratio is approximately 2:1 meaning that the final decelerated energy is about half the energy of the beam passing through the analyzer magnet 302. The voltage $V_f$ 65 on the center focusing electrode 61 (see FIG. 3) is slightly more negative by about 1-3 kV than the analyzer vacuum housing 20 of the analyzer magnet. Although the phenomena is not completely understood, it has been found in the low energy regime that the beam current is improved by 10-30% by applying just a small decel voltage $V_d$ of about 100V.

As shown by the data in FIG. 17A, the use of a neutralizing gas such as $SF_6$, injected in the region following the decel system 306, is particularly effective, because of the low energy of the beam following deceleration, and the susceptibility to space-charge blow-up in a long beam line, such as that shown in FIG. 13.

One of ordinary skill in the art can appreciate other implementations of using gas or vapors to substantially neutralize the intrinsic positive space charge of low energy ion beams, including: using other electronegative gases such as water vapor ($H_2O$) or BF3 and admitting the gas or vapor into other regions after the analyzer magnet of a long beam line, such as in the quadrupole or collimator vacuum chambers, wherein the beam is susceptible to space-charge blow-up at low energies.

The performance of this system shows the practicality of and the tremendous improvement in drift-mode beam current that can be realized by using cluster ions in general and borohydride ions in particular. The results pave the way for a new generation of ion implanter tools and have put to rest previous and somewhat widely held concerns that such beams could turn out to be difficult to transport, and even more difficult to scan, in the vacuum system and general beam line architecture commonly used in ion implanters. Even with the long beam path through the scanning and collimator magnets, gas attenuation measurements show that the beam loss from gas scattering, neutralization, and ion break-up, is only a few percent.

Alternative embodiments of FIGS. 1 and 13 employ a dual mode ion source. As previously described by T. Horsky, one form of a dual mode ion source can operate in either the electron impact mode that has just been described, e.g. to produce the molecular ions, or in an arc discharge mode, to produce high currents of monomers and multiply-charged ions. The ions produced in each mode of operation can be extracted through the same slot-form aperture by the same ion optical system, and pass through the same large gap of the analyzer magnet and through the ion implanter beamline described herein, with of course suitable variation of the mass-selection aperture 50 of FIG. 4 or FIGS. 10A-10D. Thus, advantage can be taken of the mass resolution $\geq 60$ for monomer dopants, using a narrow aperture, e.g. of 6 to 8 mm, while a much larger mass selection aperture is employed for molecular ions having multiple dopant atoms, for instance an aperture of 28 or 29 mm for ions of $B_{18}H_x$ and $B_{10}H_x$, to utilize the current from a number of mass peaks.

In one preferred form, a dual mode ion source is constructed to have an electron gun to provide a formed electron beam and a separate arc emitter. For electron impact ionization, only the electron gun is used; to produce large monomer currents and multiply-charged ions, only arc operation is used, the arc emitter striking a plasma discharge similar to that of a Bernas-type source, through typically of intensity lower than commonly used in Bernas sources. Such a dual mode ion source incorporates both vapor and gas inlet passages.

Figure 18:
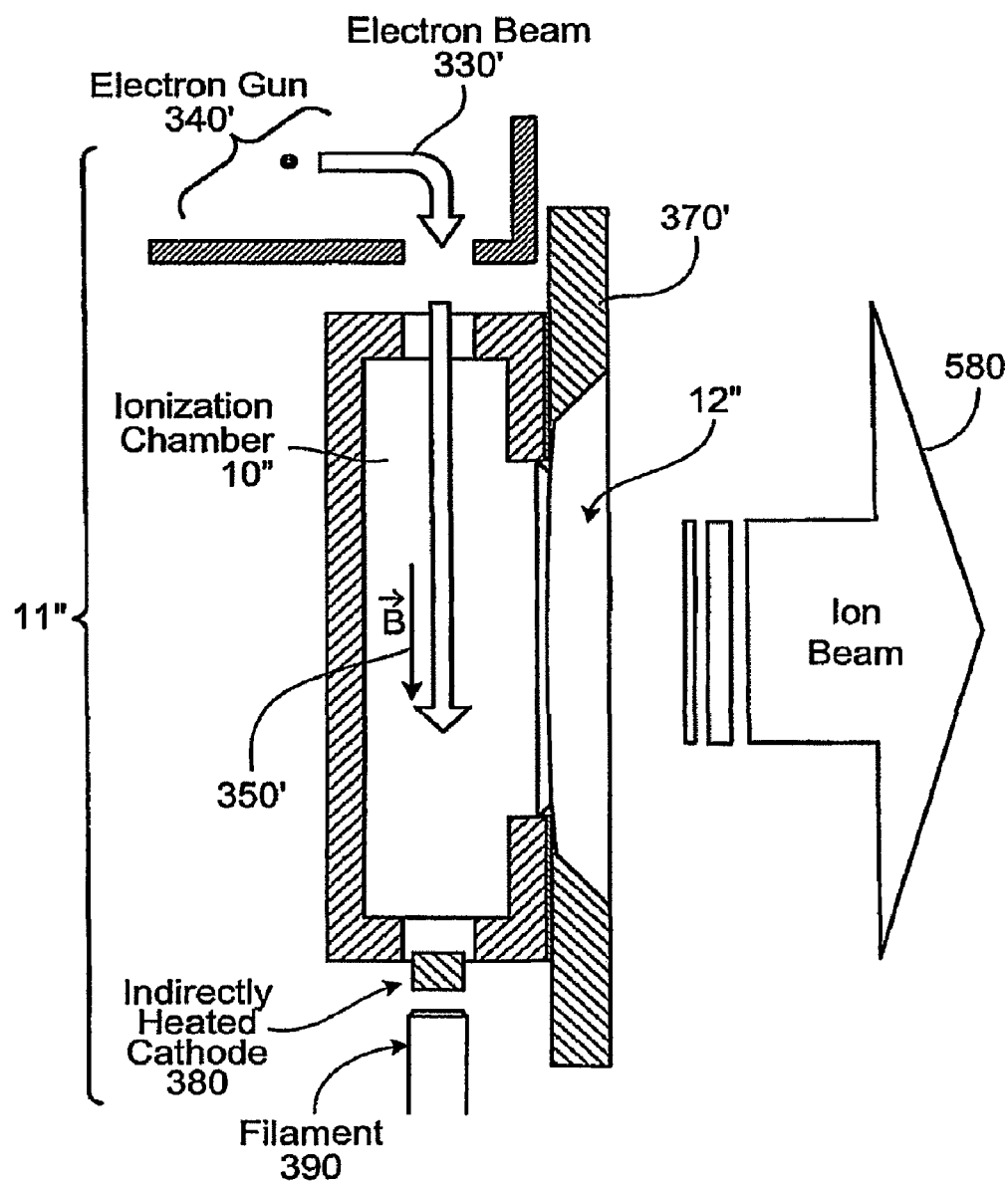
FIG. 18 is a view similar to that of FIG. 14 of a dual mode ion source.

An example of a dual mode ion source is shown in FIG. 18. Ion source 11" is similar to that of FIG. 14 but the beam dump 360 of FIG. 14 is replaced by member 280 that, during arc discharge mode, serves as an indirectly-heated cathode, heated by filament 390. As is known in general, the use of an indirectly-heated cathode permits longer lifetime than a bare filament emitter due to its filament being remotely located in a high vacuum environment, away from the source plasma.

In electron impact ionization mode, electron gun 340' and the associated magnetic fields of the embodiment of FIG. 18 perform in the same manner as described for FIG. 14. The unused portion of the electron beam may be intercepted by a beam dump provided by member 380 (the member that is switched to serve as cathode during the arc discharge mode).

In arc discharge mode, the electron gun 340' is not used. The cathode member 380 is energized by heating filament 390 to produce an arc discharge to the walls of the chamber 10". This creates a plasma column along the direction of magnetic field 350', the magnetic field typically being less than about 100 Gauss, however being sufficiently large to provide plasma confinement. In an embodiment which takes advantage of the large-gap beam transport optics of the foregoing figures described herein, the ion extraction slot 12" may be 80 mm in height, $h_s$, and 10 mm wide, $w_s$. In other embodiments that can also be employed with the large-gap beam transport described herein, the extraction slot can for instance be increased to 100 mm in height to 12.5 mm wide, while still achieving a mass resolution of greater than 60. Other smaller dimensions are also possible. Due to the large extraction area of these embodiments relative to conventional Bernas-type plasma sources, as well as due to the less intensity of the arc discharge, the plasma density produced in arc-discharge mode is less than with a typical Bernas source, but typically greater than $10^{11}$ ions/cm$^3$ and very useful for a universal ion implanter capable of providing medium dose conventional implants as well as high dose, low energy cluster doping and material modification implants.

Figure 19:
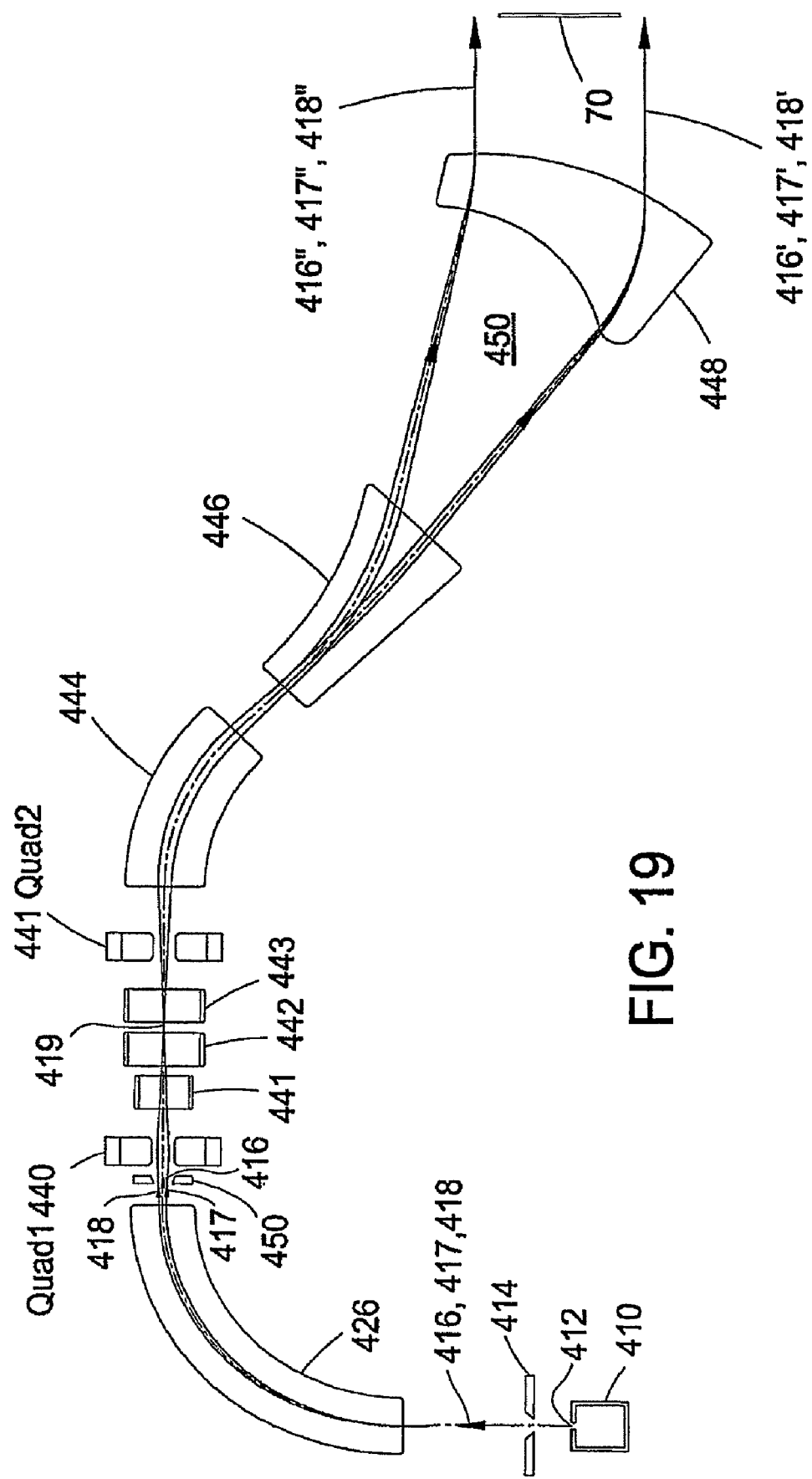
FIG. 19 is a schematic illustration of a beam-line for a medium current implanter.

Referring to FIG. 19, another embodiment is shown for a medium current ion implanter. For operation with borohydride ions, ions of different masses 416, 417, 418 are extracted from ion source 410 through aperture 412 by applying a voltage to extraction electrode 414. The ions then pass into a 90 degree analyzing magnet 426, and then through an adjustable resolving mass selection aperture 450. A cylindrical three electrode post accelerator structure 441, 442, 443 can post accelerate or decelerate the ions from the source extraction energy of 40 keV to give a final energy in the range 5-250 keV. The center electrode of the post accelerator can be supplied with an adjustable voltage to obtain various degrees of focusing of the ion beam as it passes through the post accelerator region and quadrupoles 440 and 441, magnetic or electric, located on either side of the post accelerator. Following the post accelerator there is a final energy magnet 444 which removes ions or neutral particles that have been generated with an incorrect energy during post acceleration (or deceleration). The final energy magnet is followed by a magnetic scanner 446 working in conjunction with collimator 448, which bends the beam in the same sense as the scanner magnet 446.

The strength of quadrupoles 440 and 441 in conjunction with the post-accelerator focusing electrode 442 voltage can be adjusted to optimize the beam size and angular divergence in the vertical and horizontal directions at wafer 70. Furthermore, very importantly, for borohydride ions, and indeed cluster ions in general, it is also simultaneously possible to minimize the angular deviation that would otherwise result in the presence of multiple mass ions. Because of the presence of the final energy magnet 444, it is also possible to adjust the strength of quadrupoles 440 and 441 in conjunction with the post-accelerator focusing electrode 442 so that not only is the angular deviation from multiple mass ions substantially eliminated, but also the horizontal broadening from the presence of multiple mass ions can be substantially eliminated in the beam as it scans across wafer 70. The paths of the central rays for the different mass ions 416, 417, 418 cross over at 419 near the focus electrode 442. This compensates for the subsequent, collective mass dispersion occurring in the final energy magnet 444, the beam scanner magnet 446, and the collimator 448. Such a feature is commercially useful in a medium current implanter to improve implant quality and maximize wafer throughput.

The ion source and extraction optics employed in the embodiment of FIG. 19 may be suitably scaled versions of those described with respect to FIGS. 14-16B and FIG. 18.

A number of embodiments have been described. Nevertheless, it will be understood that various modifications may be made without departing from the spirit and scope of invention. Accordingly, other embodiments are within the scope of the following claims.

What is claimed is:

1. A multipurpose ion implanter beam line configuration comprising a mass analyzer magnet followed by a magnetic scanner and magnetic collimator combination that introduce bends to the beam path, the beam line constructed for enabling implantation of common monatomic dopant ion species cluster ions, the beam line configuration having a mass analyzer magnet defining a mass selection aperture and a pole gap of substantial width between ferromagnetic poles of the magnet, the analyzer magnet sized to accept an ion beam from a slot-form ion source extraction aperture of at least about 80 mm height and at least about 7 mm width, and to produce dispersion at the mass selection aperture in a plane corresponding to the width of the beam, the mass selection aperture capable of being set to a mass-selection width sized to select a beam of the cluster ions of the same dopant species but incrementally differing molecular weights, the mass selection aperture also capable of being set to a substantially narrower mass-selection width and the analyzer magnet having a resolution at the mass selection aperture sufficient to enable selection of a beam of monatomic dopant ions of substantially a single atomic or molecular weight, the magnetic scanner and magnetic collimator being constructed to successively bend the ion beam in the same sense, which is in the opposite sense to that of the bend introduced by the analyzer magnet of the beam line.

2. The ion implanter beam line of claim 1 in which the mass selection aperture is capable of being set to a first setting for monatomic ion species and a second setting of at least fifteen times the mass-selection width of the first setting for accepting cluster ions generated from boron-containing compounds.

3. The ion implanter beam line of claim 1 in which the resolution of the mass analyzer magnet at the mass selection aperture for monatomic doping ions is at least 60.

4. The ion implanter beam line of claim 1 in which the mass analyzer magnet is sized constructed and arranged to form at the mass selection aperture a conjugate image in the mass dispersive plane of the width of the ion source extraction aperture.

5. The ion implanter beam line of claim 4 in which the mass selection aperture of the analyzer magnet is capable of being set to an aperture width of at least 30 mm.

6. The ion implanter beam line of claim 1 in which the analyzer magnet is constructed to analyze a beam extracted from a slot-form ion source extraction aperture of at least 12 mm width and 90 mm height.

7. The ion implanter beam line of claim 6 in which the mass selection aperture is capable of being set to a first setting for the monatomic ion species and to a second setting of at least fifteen times the mass-selection width of the first setting for accepting cluster ions of multiple masses near a peak of interest, and the resolution of the mass analyzer magnet at the mass selection aperture for monatomic doping ions is at least 60.

8. The ion implanter beam line of claim 1 in which the slot-form extraction aperture width is about 12.5 mm and height about 100 mm.

9. The ion implanter beam line of claim 1 in combination with an ion source constructed to produce ions of current density up to about 1 mA/cm$^2$ by an ionization mode employing a formed electron beam, the ion source constructed to receive feed material alternatively in the forms of gas and heated vapor.

10. The ion implanter beam line of claim 1 in which the ion source is constructed to function alternatively in a second ionization mode employing arc discharge.

11. The ion implanter beam line of claim 1 including means to introduce, downstream of the analyzer magnet, a gas to generate negative ions within the ion beam by interaction of the gas with the ion beam.

12. The ion implanter beam line of claim 11 in which the gas is $SF_6$.

13. The ion implanter beam line of claim 12 in which the $SF_6$ gas is provided at pressure between about $5 \times 10^{-7}$ to $10^{-5}$ torr.

14. The ion implanter beam line of claim 12 in which the lens is a magnetic quadrupole triplet focusing lens.

15. The ion implanter beam line of claim 11 in which there is post accelerator structure beyond the magnetic analyzer that can post decelerate the ions from the source extraction energy to a lower energy.

16. The ion implanter beam line of claim 1 in which the analyzer magnet is a sector magnet constructed to produce an adjustable magnetic field in the pole gap including a field exceeding about 10 kGauss.

17. The ion implanter beam line of claim 1 constructed to select about 80 keV ions generated from ocatadecaborane.

18. The ion implanter beam line of claim 17 including a decelerating unit following the analyzer magnet and preceding the quadrupole lens, the lens controlled to control beam divergence resulting from deceleration of the beam at the decelerating unit.

19. The ion implanter beam line of claim 1 in which the mass analyzer comprises a sector magnet having a radius R of about 500 mm, a sector angle $\phi$ of o about 120 degrees, a distance b from the effective pole exit boundary to the mass resolving aperture of about 195 mm, the mass analyzer having a magnification M of about −0.83, the analyzer magnet constructed to analyze an ion beam from a source having an extraction aperture width of about 12.5 mm, the analyzer magnet having mass resolution m/Δm of the order of about 88.

20. The ion implanter beam line of claim 1 including a multiple element quadrupole focusing lens in the portion of the beam line following the analyzer magnet, the lens arranged to control the dimensions of the beam in orthogonal directions of the beam cross-section.

21. The ion implanter beam line of claim 20 in which the lens has at least three quadrupole elements and is constructed to simultaneously control the dimensions and angular divergence of the beam in orthogonal directions of the beam cross-section.

22. The ion implanter beam line of claim 21 in which the lens is a quadrupole triplet focusing lens.

23. The ion implanter beam line of claim 22 in which the lens is a magnetic 0 quadrupole triplet focusing lens.

24. The ion implanter beam line of claim 22 constructed to produce a beam having an elongated cross-section profile entering the quadrupole triplet focusing lens, with the long dimension of the beam profile in the plane normal to the plane of the bend of the analyzer magnet, in combination with a control adapted to cause the first lens element of the triplet to cause focusing in the long profile dimension, the second lens element to have polarity opposite to that of the first element to cause focusing in the short dimension and defocusing in the long dimension, and the third lens element to have the same polarity as the first element, field strengths of the lens elements controlled, respectively, to achieve simultaneous focusing in both dimensions of the elongated profile.

25. The ion implanter beam line of claim 20 having beam line features and parameters of substantially the following values;
  A. Analyzer Magnet: R=500 mm, $\phi$=120°; G=118 mm; Si=31 mm; $s_2$=8.6 mm; $h_1$=8.7 mm; $h_2$=4.7 mm; W=166 mm; bending power=80 keV octadecaborane;
  B. Mass selection aperture: about 8 mm minimum to about 38 mm maximum;
  C. Quadrupole triplet focusing lens: aperture: 80 diagonal between pole tips; pole tip field adjustable 0-5 kGauss;
  D. Beam Scanning Magnet; Vertical gap=80 mm; bending power=80 keV octadecaborane;
  E. Collimator: Bending radius 900 mm; Pole gap=8 mm; bending power=80 keV octadecaborane and the total deflection introduced by the scanner and collimator combination being about 30°.

26. The ion implanter beam line of claim 1 having an ion source capable of ionizing a material to produce cluster ions by electron impact, the implanter having, within a vacuum housing, a beam scanner and collimator following the mass analyzer magnet, and a system for admitting a gas, capable of forming negative ions by interaction with the cluster ion beam, into a region of the vacuum housing of the scanner or collimator to provide neutralizing negative ions to the beam.

27. An ion implanter beam line configuration constructed for enabling implantation of cluster ions of multiple masses near a peak of interest, the beam line configuration configuration comprising a mass analyzer magnet followed by a magnetic scanner and magnetic collimator combination that introduce bends to the beam path, the mass analyzer magnet defining a pole gap between ferromagnetic poles of the magnet and a mass selection aperture, the pole gap sized to accept an ion beam from a low density ion source that produces the cluster ions, the mass selection aperture capable of being set to a mass-selection width sized to select a beam of the cluster ions of the same dopant species but incrementally differing molecular weights, the ion implanter beam line including a multi-element focusing system in the portion of the beam line following the analyzer magnet which comprises multiple quadrupole focusing elements, the individual field strengths of the lens elements of the lens system adjusted to control the dimensions of the beam in orthogonal directions of the beam cross-section and to simultaneously and substantially remove angular deviation at the target substrate that otherwise would occur as a result of the range of different masses of the cluster ions in the ion beam the magnetic scanner and magnetic collimator being constructed to successively bend the ion beam in the same sense, which is in the opposite sense to that of the bend introduced by the analyzer magnet of the beam line.

28. The ion implanter beam line of claim 27 in which the lens system has at least three quadrupole elements and is constructed to simultaneously control the dimensions and angular divergence of the beam in orthogonal directions of the beam cross-section by quadrupole fields.

29. The ion implanter beam line of claim 27 in which the lens system is a quadrupole triplet focusing lens.

30. The ion implanter beam line of claim 29 constructed to produce a beam with an elongated cross-section profile entering the quadrupole triplet focusing lens, with the long dimension of the beam profile in the plane normal to the plane of the bend of the analyzer magnet, in combination with a control adapted to cause the first lens element of the triplet to cause focusing in the long profile dimension, the second lens element to have polarity opposite to that of the first element to cause focusing in the short dimension and defocusing in the long dimension, and the third lens element to have the same polarity as the first element, field strengths of the lens elements controlled, respectively, to achieve simultaneous focusing in both dimensions of the elongated profile.

31. The ion implanter beam line of claim 24 in which adjustable extraction optics associated with an ion source are constructed to produce a degree of beam convergence in the non-dispersive plane of the analyzer magnet and is optimized to size the beam to be accepted at the entrance to the quadrupole over a wide range of beam currents from a few microamps to a few milliamps, and a wide range of energies, from about 4 keV to 80 keV, the quadrupole triplet providing final optimization of the beam size and angular divergence at the wafer or substrate in both the non-dispersive (vertical) and dispersive (horizontal) planes at the wafer or substrate including compensating for variations in beam size and angle introduced by the extraction optics over the range of energies and currents.

32. The ion implanter beam line of claim 27 including a decelerating unit following the analyzer magnet and preceding the quadrupole lens system in the form of a quadrupole triplet lens, the quadrupole lens system controlled to control beam divergence resulting from deceleration of the beam at the decelerating unit.

33. An ion implantation beam line for use with an ion source, the beam line comprising a mass analyzer magnet followed by a magnet scanner and magnetic collimator combination that introduce bends to the beam path, the analyzer magnet for an ion implanter beam line comprising a sector magnet having a center path radius of about 500 mm, a sector angle of about 120° and a pole gap of at least about 80 mm, the magnet associated with a single pair of coils, the magnet having entrance and exit pole faces perpendicular to the axis of the ion beam path entering and leaving the pole gap, the analyzer magnet having substantially no focusing effect upon the beam in the plane perpendicular to the plane of bend of the sector magnet, the magnetic scanner and magnetic collimator being constructed to successively bend the ion beam in the same sense, which is in the opposite sense to that of the bend introduced by the analyzer magnet of the beam line.

34. The ion implantation beam of claim 33 in combination with an ion focusing system preceding the magnet providing beam focusing in the plane perpendicular to the mass-dispersive plane of the magnet.

35. The ion implantation beam of claim 33 in which the focusing system comprises lens elements of an ion extraction system associated with the ion source.

36. The ion implantation beam claim 33 in which the pole gap of the analyzer magnet is substantially wider than the corresponding dimension of the maximum size ion beam it is constructed to pass, there being a lining of graphite or silicon between faces of the poles and the beam path.

37. The ion implantation beam of claim 33 in which pole members defining the pole gap have pole faces shaped with trenches and shims that respectively lower and raise the pole surfaces toward the median plane of the beam path to shape the magnetic field in manner enabling use of relatively small pole width in relation to the pole gap dimension.

38. The ion implantation beam of claim 33 in which pole members defining the pole gap are embedded in and sealed to the wall of a vacuum housing of nonmagnetic material through which the ion beam passes while subjected to the magnetic field of the analyzer magnet, and ferromagnetic structure of the magnet between the pole members being located outside of the vacuum housing.

39. The ion implantation beam of claim 33 in which the analyzer magnet is a sector magnet constructed to produce an adjustable magnetic field in the pole gap including a field exceeding about 10 kGauss.

40. The ion implantation beam of claim 33 in which the analyzer magnet is constructed to analyze a beam extracted from a slot-form ion source extraction aperture of at least 12 mm width and 90 mm height.

* * * * *